US011827512B2

United States Patent
Martin et al.

(10) Patent No.: US 11,827,512 B2
(45) Date of Patent: Nov. 28, 2023

(54) CONNECTED FIELD EFFECT TRANSISTORS

(71) Applicant: Hewlett-Packard Development Company, L.P., Spring, TX (US)

(72) Inventors: Eric Martin, Corvallis, OR (US); Rogelio Cicili, San Diego, CA (US); Tsuyoshi Yamashita, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 496 days.

(21) Appl. No.: 17/251,236

(22) PCT Filed: Sep. 24, 2018

(86) PCT No.: PCT/US2018/052443
§ 371 (c)(1),
(2) Date: Dec. 11, 2020

(87) PCT Pub. No.: WO2020/068035
PCT Pub. Date: Apr. 2, 2020

(65) Prior Publication Data
US 2021/0246013 A1 Aug. 12, 2021

(51) Int. Cl.
*B81B 7/00* (2006.01)
*B81B 1/00* (2006.01)
(Continued)

(52) U.S. Cl.
CPC ........... *B81B 7/0006* (2013.01); *B41J 2/0455* (2013.01); *B41J 2/0458* (2013.01);
(Continued)

(58) Field of Classification Search
CPC .. B41J 2/0455; B41J 2/04541; B41J 2/04543; B41J 2/0458; B81B 1/00; B81B 7/0006;
(Continued)

(56) References Cited

U.S. PATENT DOCUMENTS

| 5,892,524 A | 4/1999 | Silverbrook |
| 6,406,115 B2 | 6/2002 | Mantell et al. |

(Continued)

FOREIGN PATENT DOCUMENTS

| EP | 1384583 A1 | 1/2004 |
| WO | WO-2017074443 | 5/2017 |
| WO | 2018/067141 A1 | 4/2018 |

*Primary Examiner* — Thinh H Nguyen
(74) *Attorney, Agent, or Firm* — Foley & Lardner LLP

(57) ABSTRACT

Examples include a fluidic die. The fluidic die comprises an array of field effect transistors including field effect transistors of a first size and field effect transistors of a second size. At least one connecting member interconnects at least some of the field effect transistors of the array of field effect transistors. The fluidic die further comprises a first fluid actuator connected to a first set of field effect transistors having at least one field effect transistor of the first size. The die includes a second fluid actuator connected to a second respective set of field effect transistors having a first respective field effect transistor of the second size interconnected to at least one other field effect transistor of the array.

15 Claims, 16 Drawing Sheets

(51) Int. Cl.
*B81B 3/00* (2006.01)
*B81C 1/00* (2006.01)
*B41J 2/045* (2006.01)

(52) U.S. Cl.
CPC ....... *B41J 2/04541* (2013.01); *B41J 2/04543* (2013.01); *B81B 1/00* (2013.01); *B81B 3/0021* (2013.01); *B81C 1/00071* (2013.01); *B81C 1/00095* (2013.01); *B81C 1/00119* (2013.01); *B81B 2201/05* (2013.01); *B81B 2203/0338* (2013.01)

(58) Field of Classification Search
CPC .............. B81B 3/0021; B81B 2201/05; B81C 1/00071; B81C 1/00119
See application file for complete search history.

(56) References Cited

U.S. PATENT DOCUMENTS

| | | |
|---|---|---|
| 6,977,185 B2 | 12/2005 | Bryant et al. |
| 7,032,986 B2 | 4/2006 | Corrigan |
| 7,104,624 B2 | 9/2006 | Schloeman et al. |
| 7,604,312 B2 * | 10/2009 | Wade ................... B41J 2/04548 347/14 |
| 7,722,144 B2 | 5/2010 | Benjamin et al. |
| 7,784,914 B2 | 8/2010 | Dodd et al. |
| 9,033,469 B2 | 5/2015 | Gardner et al. |
| 9,090,060 B2 | 7/2015 | Cleare |
| 10,022,962 B1 | 7/2018 | Linn et al. |
| 2015/0091989 A1 | 4/2015 | Govyadinov et al. |

* cited by examiner

CONNECTED FIELD EFFECT TRANSISTORS

BACKGROUND

Fluidic dies may process small volumes of fluid. For example, nozzles of fluidic dies may facilitate ejection of fluid drops. In some fluidic dies, various electrical components may be used to analyze, convey, and/or perform other such processes for fluid of the fluidic die. Accordingly, various arrangements of electrical components may be implemented in fluidic dies to enable and control performance of such processes. Some example fluidic dies may be fluid ejection dies, where the fluid drops may be controllably ejected via nozzles of the fluid ejection die.

DRAWINGS

Figure 14A:
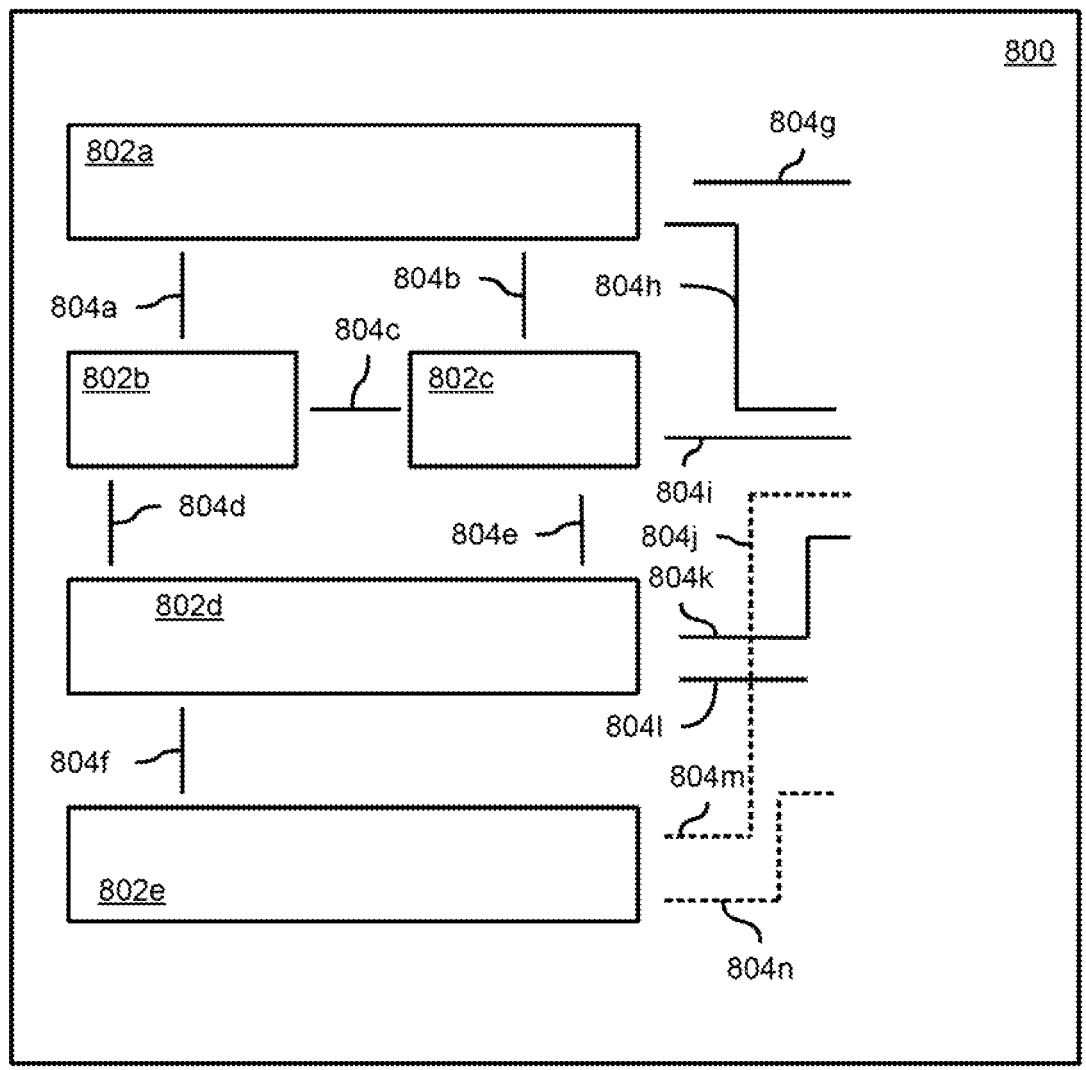
Figure 14B:
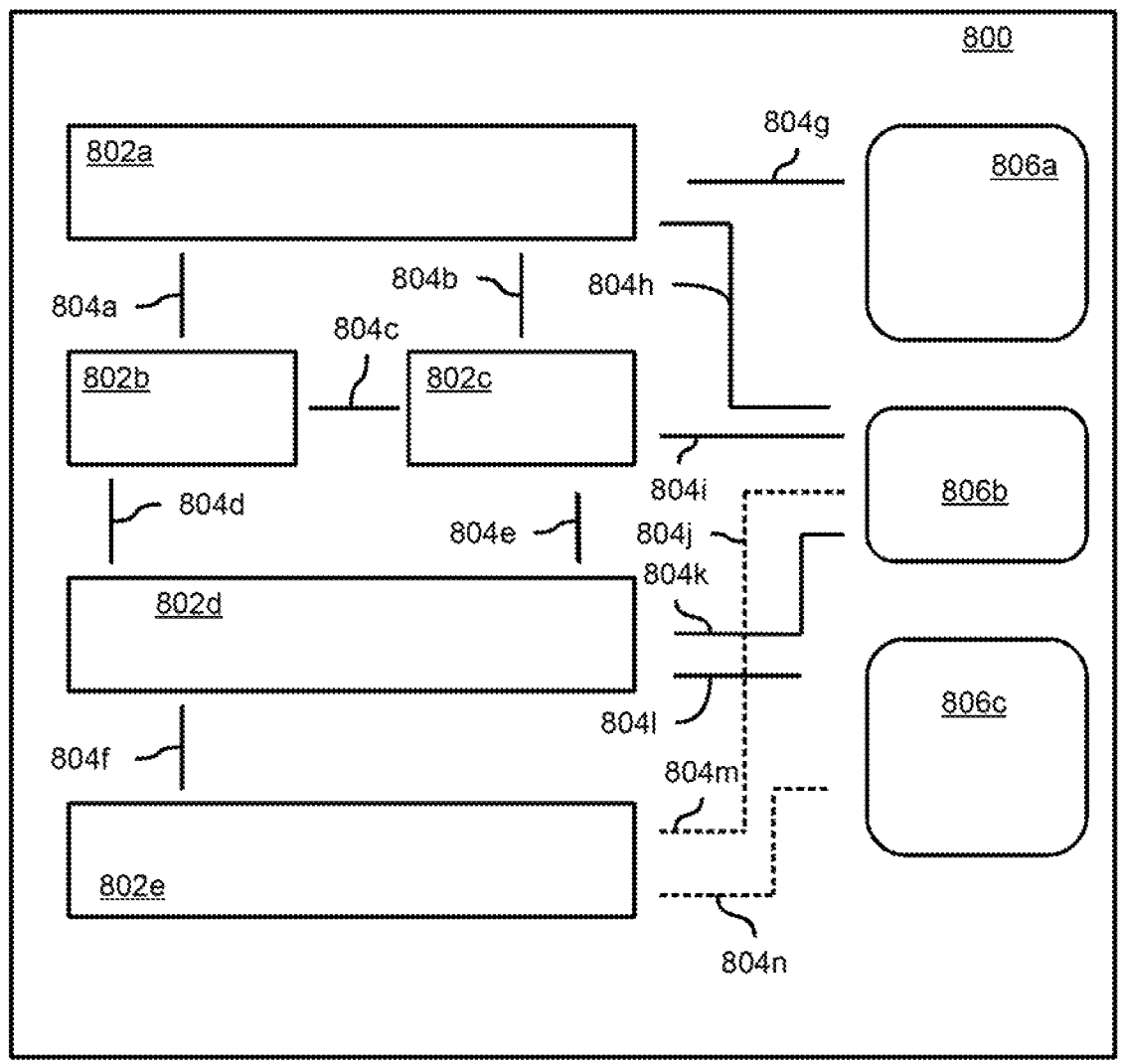
Figure 14C:
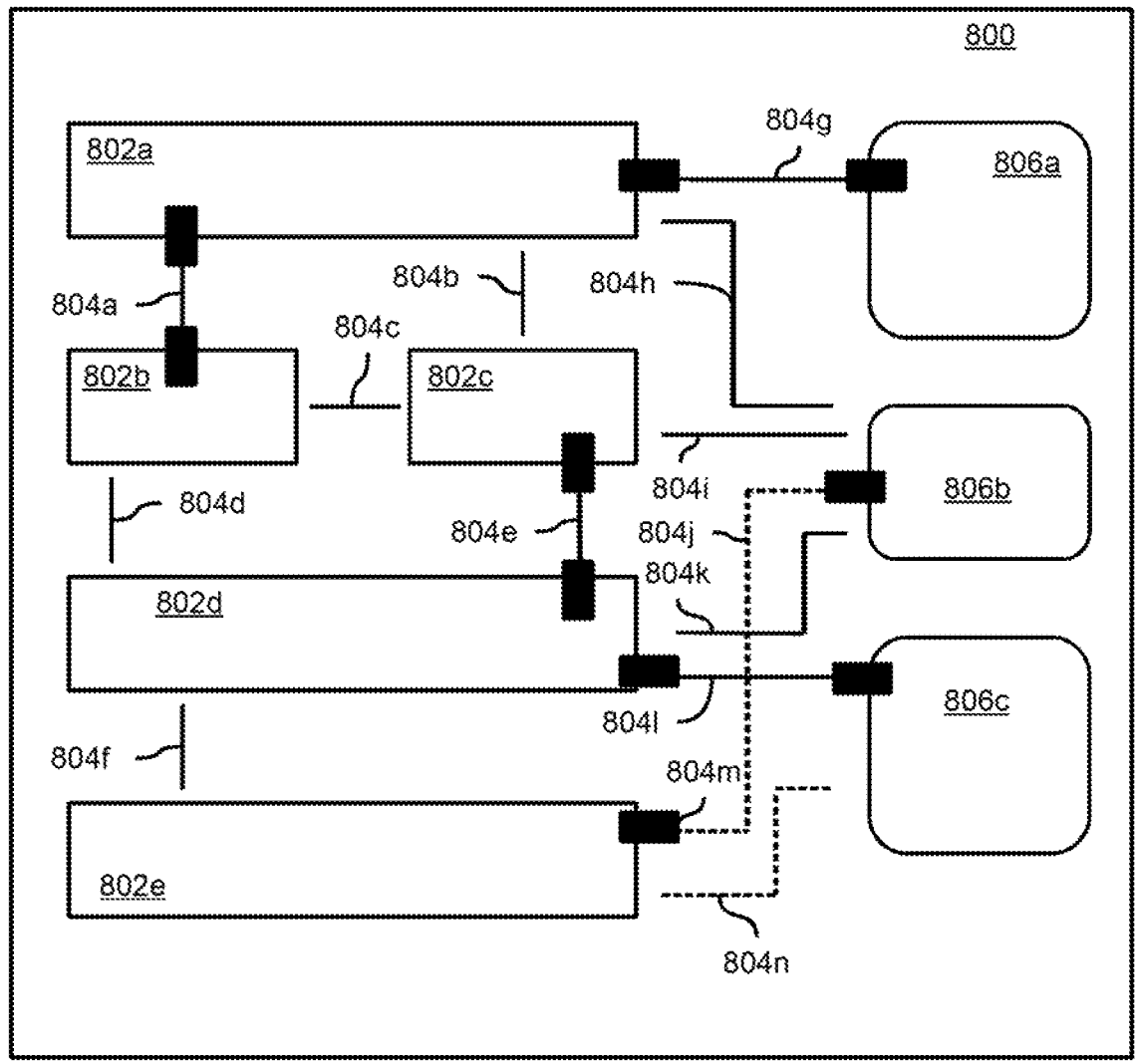

FIGS. 14A-C are block diagrams that illustrate an example process.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DESCRIPTION

Examples of fluidic dies may comprise fluid actuators. The fluid actuators may include a piezoelectric membrane-based actuator, a thermal resistor-based actuator, an electrostatic membrane actuator, a mechanical/impact driven membrane actuator, a magneto-strictive drive actuator, or other such elements that may cause displacement of fluid responsive to electrical actuation. To control actuation of such fluid actuators, examples may further include field effect transistors (FETs) which may be connected to the fluid actuators. Accordingly, electrical control of the connected FETs may enable selective control of fluid actuators of the fluidic die.

The fluid actuators may be arranged in respective sets of fluid actuators, where each such set of fluid actuators may be referred to as a "primitive" or a "firing primitive." A primitive generally comprises a group of fluid actuators that each have a unique actuation address. In some examples, electrical and fluidic constraints of a fluidic die, may limit which fluid actuators of each primitive may be actuated concurrently for a given actuation event. Therefore, primitives facilitate addressing and subsequent actuation of fluid ejector subsets that may be concurrently actuated for a given actuation event. To address fluid actuator within a primitive, the field effect transistors may be similarly arranged. Accordingly, addressing a field effect transistor, by enabling a gate of a field effect transistor, may cause electrical actuation of a fluid actuator connected to the field effect transistor. Therefore, for each primitive of fluid actuators, a fluidic die may comprise a primitive of field effect transistors.

Fluidic dies, as used herein, may correspond to a variety of types of integrated devices with which small volumes (e.g., picoliter volumes, nanoliter volumes, microliter volumes, etc.) of fluid may be pumped, mixed, analyzed, ejected, etc. Such fluidic dies may include fluid ejection dies, such as printheads, additive manufacturing distributor components, digital titration components, and/or other such devices with which volumes of fluid may be selectively and controllably ejected. Other examples of fluidic dies include fluid sensor devices, lab-on-a-chip devices, and/or other such devices in which fluids may be analyzed and/or processed.

In some example fluidic dies, a fluid actuator may be disposed in a fluid chamber, where the fluid chamber may be fluidically coupled to a nozzle. In some examples, a fluid chamber may be referred to as a "pressure chamber." The fluid actuator may be actuated such that displacement of fluid in the fluid chamber occurs and such displacement may cause ejection of a fluid drop via an orifice of the nozzle. Accordingly, a fluid actuator disposed in a fluid chamber that is fluidically coupled to a nozzle may be referred to as a "fluid ejector." Moreover, the fluidic component comprising the fluid actuator, fluid chamber, and nozzle may be referred to as a "drop generator."

Example fluidic dies described herein may comprise microfluidic channels in which fluidic actuators may be disposed. In such implementations, actuation of a fluid actuator disposed in a microfluidic channel may generate fluid displacement in the microfluidic channel. Accordingly, a fluid actuator disposed in a microfluidic channel may be referred to as a "fluid pump." The distinction between implementations of a fluid actuator is an example of different fluid actuator types. For example, a fluid actuator implemented as a fluid ejector may be considered a different fluid actuator type as compared to a fluid actuator implemented as a fluid pump.

Microfluidic features, such as microfluidic channels or fluid chambers may be formed by performing etching, microfabrication (e.g., photolithography), deposition, micromachining processes, or any combination thereof in or on a substrate of a fluidic die. Some example substrates may include silicon-based substrates, glass-based substrates, gallium arsenide-based substrates, and/or other such suitable types of substrates for microfabricated devices and structures. Accordingly, microfluidic channels, chambers, nozzles, orifices, and/or other such features may be defined by surfaces fabricated in the substrate and/or materials deposited on the substrate, of a fluidic die. Furthermore, as used herein a microfluidic channel may correspond to a channel of sufficiently small size (e.g., of nanometer sized scale, micrometer sized scale, millimeter sized scale, etc.) to facilitate conveyance of small volumes of fluid (e.g., picoliter scale, nanoliter scale, microliter scale, milliliter scale, etc.).

Due to the various arrangements and configurations of fluid actuators that may be implemented in an example fluidic die, electrical constraints and demands of such fluid actuators and the control logic connected to such fluid actuators may be different for fluid actuators of a fluidic die. Accordingly, electrical characteristics of FETs connected to fluid actuators of a fluidic die may be different, where the electrical characteristics of the connected FETs may be based at least in part on operating parameters of fluid actuators to which the FETs may be connected. As used herein, operating parameters of fluid actuators may include, for example, current, voltage, and/or power levels at which a fluid actuator may be operated to perform fluid displacement. In some fluidic dies, the FETs and associated logic connected to each fluid actuator may be designed to the specification of the fluid actuators of the fluidic die. However, in some cases, a substrate including the FETs and associated logic may be used in more than one fluidic die design, where operating parameters of fluid actuators of the fluidic die designs may be different.

Accordingly, fluidic die processing efficiency may be increased by using substrates having flexible arrangements of field effect transistors formed thereon. During forming and processing of the substrates to form fluidic channels, chambers, fluid actuators, nozzles and/or other components, flexible field effect transistor arrangements may be set to the design specifications of the fluidic die in which the substrate may be implemented. For example, interconnect layers may be configured for arrangements of FETs to deliver optimal energy to various different types of fluid actuators. Configuring of such interconnect layers may include connecting some connecting members to interconnect some FETs as well as to connect FETs to fluid actuators.

Examples provided herein may include fluidic dies and processes for generating fluidic dies in which configurations of field effect transistors may be set when forming the fluidic features and components of the fluidic die. An example fluidic die may comprise an array of field effect transistors, where the array of field effect transistors may include field effect transistors of a first size, and the array may further include field effect transistors of a second size. As used herein, a size of a field effect transistor may refer to electrical characteristics of field effect transistors. For example, a field effect transistor of a first size may have current, voltage, and power ranges and limits. Physical characteristics of a field effect transistor may correspond to such current, voltage, and power ranges and limits. For example, current ranges and limits of a field effect transistor may correspond to a gate width of a field effect transistor. Accordingly, physical characteristics of a field effect transistor correspond to electrical characteristics. Therefore, as used herein a size of a field effect transistor refers to the physical and electrical characteristics of a field effect transistor, where a greater physical dimensions of a field effect transistor may correspond to higher electrical limits. For example, a greater gate width may correspond to a higher current capacity.

The die may further include connecting members that interconnect some of the field effect transistors of the array. As used herein, connecting members may include jumpers, conductive traces, and/or other such electrical connecting components. For example, a connecting member may comprise at least one conductive trace. As another example, a connecting member may comprise at least two conductive traces. Moreover, as used herein, interconnected field effect transistors may include field effect transistors having connected gates, sources, and drains. Therefore, as used herein, connecting members may connect gates, sources, and/or drains, between field effect transistors such that the field effect transistors may operate in parallel. As a particular example, a connecting member that connects two field effect transistors may include a first conductive trace that connects sources of the field effect transistors and a second conductive trace that connects gates of the field effect transistors. In this example, drains of the two field effect transistors may be commonly connected to a voltage supply. Furthermore, connecting members may connect field effect transistor sets to fluid actuators. Arrangements of field effect transistors connected to a fluid actuator may be referred to as sets of field effect transistors. In such examples, the sets of field effect transistors may include different arrangements and numbers of field effect transistors of different, sizes based at least in part on operating parameters of fluid actuators to which the sets of field effect transistors may be connected.

For example, a first fluid actuator of an example fluidic die may be connected to a set of field effect transistors having at least one field effect transistor of a first size. A second fluid actuator of the example fluidic die may be connected to a set of field effect transistors having a first field effect transistor of a second size interconnected with at least one other field effect transistor. In some examples the arrangements of field effect transistors of at least two different sizes in sets of field effect transistors may be based at least in part on operating parameters of fluid actuators to which the sets are connected.

Figure 1:
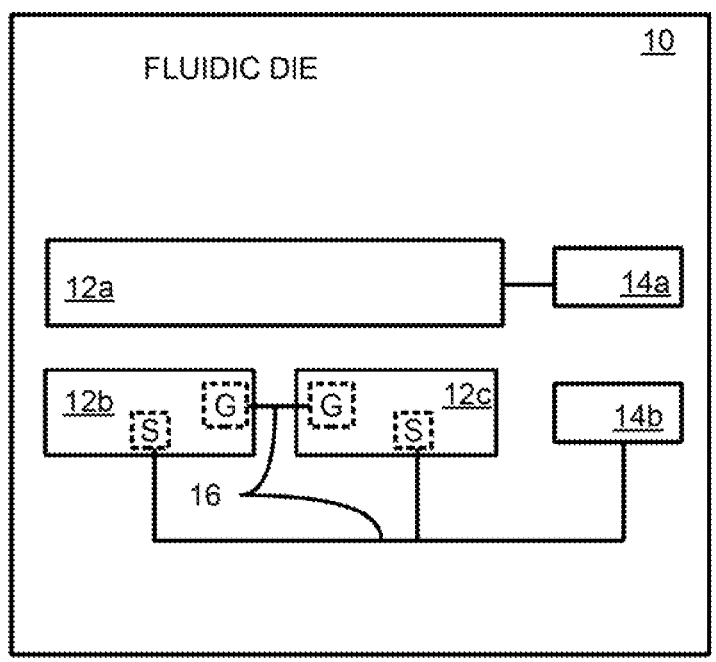
FIG. 1 is a block diagram that illustrates some components of an example fluidic die.

Turning now to the figures, and particularly to FIG. 1, this figure provides a block diagram of an example fluidic die 10. The fluidic die 10 includes an array of field effect transistors 12a-c. In this example, a first field effect transistor 12a is a first size, and a second field effect transistor 12b and a third field effect transistor 12c are a second size. Furthermore, the fluidic die includes fluid actuators 14a-b. A first fluid actuator 12a of the fluidic die 10 is connected to a first set of field effect transistors, that, in this example, includes a first field effect transistor 12a. Furthermore, the fluidic die 10 further includes a connecting member 16 that interconnects a second field effect transistor 12b and a third field effect transistor 12c of the array such that the second field effect transistor 12b and the third field effect transistor 12c form a second set f field effect transistors 12b-c. In this example, the second set of field effect transistors 12b-c may be connected to a second fluid actuator 14b. As may be noted, the connecting member 16 connects a respective gate (labeled 'G') of the second field effect transistor 12b and a gate of the third field effect transistor 12c, and the connecting member further connects a source (labeled 'S') of the second field effect transistor 12b and a source of the third field effect transistor 12c. Accordingly, as used herein, a connecting member that interconnects at least two field effect transistors may include electrical connections between sources, gates, and/or drains of the field effect transistors.

Furthermore, in this example, the first fluid actuator 14a is connected to the first set of field effect transistors 12a that includes only the first field effect transistor 12a of the first size. The second fluid actuator 14b is connected to the second set of field effect transistors having the second field effect transistor 12b of the second size interconnected with the third field effect transistor 12c that is of the second size.

In this example, the second size of the second and third field effect transistors 12*b-c* may correspond to approximately half of the first size of the first field effect transistor 12*a*. Therefore, the power delivery characteristics of the FETs of the second size may be approximately half of the electrical characteristics of the first size of the first field effect transistor. By connecting the second field effect transistor 12*b* and the third field effect transistor 12*c* such that the FETs operate in parallel, the second set of field effect transistors 12*b-c* may have electrical characteristics approximately equal to the electrical characteristics of the first field effect transistor 12*a*.

Figure 2:
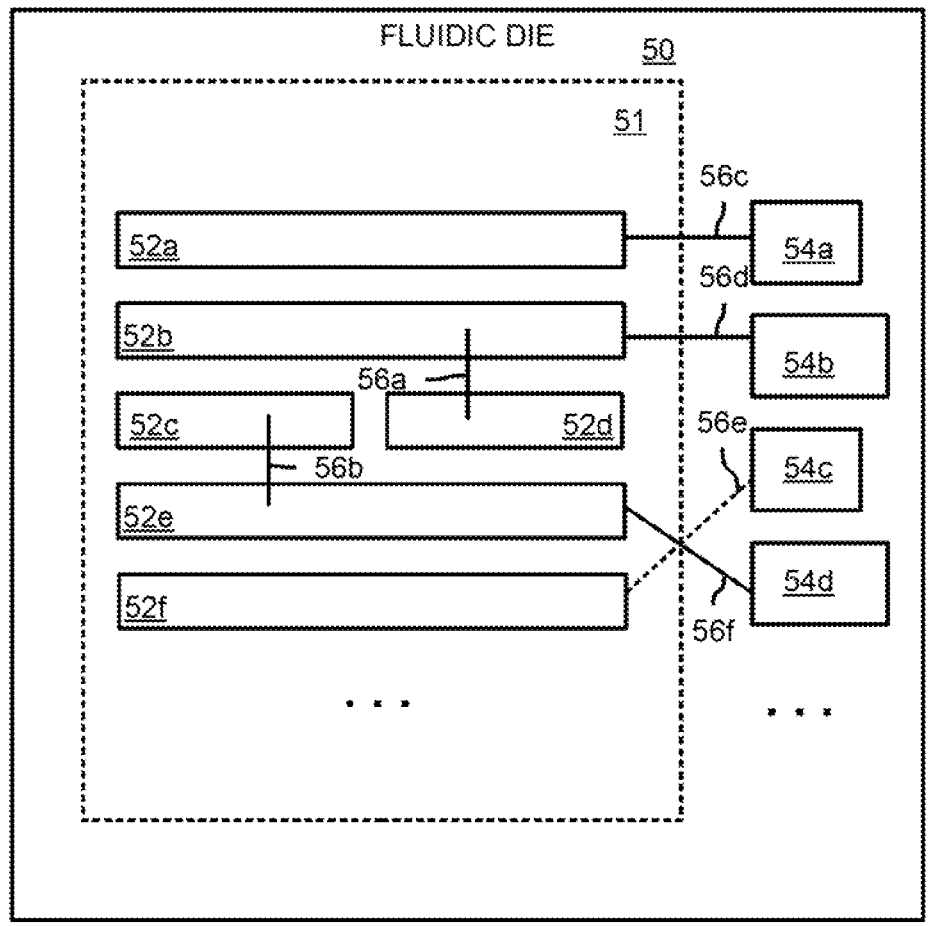
FIG. 2 is a block diagram that illustrates some components of an example fluidic die.

In FIG. 2, some components of an example fluidic die 50 are provided in a block diagram. In this example, the fluidic die 50 includes an array 51 of field effect transistors 52*a-f* and a plurality of fluid actuators 54*a-d*. As shown, the array 51 includes a first field effect transistor 52*a* of a first size, a second field effect transistor 52*b* of the first size, a third field effect transistor 52*c* of a second, size, a fourth field effect transistor 52*d* of the second size, a fifth field effect transistor 52*e* of the first size, and a sixth field effect transistor 52*f* of the first size. Moreover, the fluidic die 50 includes connecting members 56*a-b* that interconnect some field effect transistors 52*a-f*. Furthermore, the die includes connecting members 56*c-f* that connect respective sets of field effect transistors to fluid actuators 54*a-f*. In this example, a first connecting member 56*a* interconnects the second field effect transistor 52*b* and the fourth field effect transistor 52*d*. A second connecting member 56*b* interconnects the third field effect transistor 52*c* and the fifth field effect transistor 52*e*.

Accordingly, in this example, the first field effect transistor 52*a* corresponds to a first respective set of field effect transistors that is connected to a first fluid actuator 54*a* via a third connecting member 56*c*. The second field effect transistor 52*b* and the fourth field effect transistor 52*d* are connected, via the first connecting member 56*a*, and form a second respective set of field effect transistors. The second set of field effect transistors is connected to a second fluid actuator 54*b* via a fourth connecting member 56*d*. As shown, the second set of field effect transistors comprises at least one field effect transistor of the second size (i.e., the fourth field effect transistor 52*d*) interconnected with at least one other field effect transistor (i.e., the second field effect transistor 52*b*). In this example, the field effect transistors of the second set 52*b*, 52*d* are different sized field effect transistors.

The sixth field effect transistor 52*f* corresponds to a third set of field effect transistors, and the third set is connected to a third fluid actuator 54*c* via a fifth connecting member 56*e*. The third field effect transistor 56*c* and the fifth field effect transistor 52*e* are connected, via the second connecting member 56*b*, and form a fourth respective set of field effect transistors. The fourth respective set of field effect transistors is connected to a fourth fluid actuator 54*d* via a sixth connecting member 56*f*.

As may be noted in this example, the fifth connecting member 56*e* and the sixth connecting member 56*f* may overlap and be separated by an insulating material such that the arrangement of field effect transistors may be set to correspond to fluid actuator layout. In this example, the first fluid actuator 54*a* and the third fluid actuator 54*c* may correspond to a first type of fluid actuator, and the second fluid actuator 54*b* and fourth fluid actuator 54*d* correspond to a second type of fluid actuator. In this example, the first type of fluid actuator corresponds to a first fluid actuator size, and the second type of fluid actuator corresponds to a second fluid actuator size. The second fluid actuator size may be greater than the first fluid actuator size. Consequently, the fluid actuators of the second size (e.g., the second fluid actuator 54*b* and the fourth fluid actuator 54*d*) are connected to sets of field effect transistors having at least two interconnected field effect transistors. Furthermore, the fluid actuators of the first size may correspond to a first fluid drop size (having a first fluid drop volume and a first fluid drop mass), and the fluid actuators of the second size may correspond to a second fluid drop size (having a second fluid drop volume and a second fluid drop mass). In this example, the second fluid drop size may be greater than the first fluid drop size—i.e., the second fluid drop volume and/or second fluid drop mass may be greater than the first fluid drop volume and/or first fluid drop mass. While the example of FIG. 2 illustrates fluid actuator size as the differentiation between actuator types, other examples may include other differences. For example, different implementations (e.g., a fluid pump and a fluid ejector) of similarly sized fluid actuators may correspond to different arrangements of field effect transistors.

Due to the differences in fluid actuator sizes, the fluid actuators may have different operating parameters. As illustrated in this example, arrangements of field effect transistors may be flexible and facilitate designing and connecting field effect transistors based at least in part on the operating parameters of the fluid actuators to which the field effect transistors are connected. Accordingly, the number and size of field effect transistors 52*a-f* connected to each fluid actuator 54*a-d* may be based at least in part on the fluid actuator type. In this example, the fluid actuator size of the second fluid actuator 52*b* and the fourth fluid actuator 54*d* may be greater than the fluid actuator size of the first fluid actuator 54*a* and the third fluid actuator 54*c*. Consequently, the second fluid actuator 54*b* and fourth fluid actuator 54*d* may be connected to sets, of field, effect transistors having at least two interconnected field effect transistors. As used herein, a fluid, actuator size may correspond to a surface area of the fluid actuator. For example, in a thermal resistor-based fluid actuator, the fluid actuator size may correspond to the thermal resistor surface area. In a piezoelectric membrane-based fluid actuator, the fluid actuator size may correspond to a surface area of the flexible membrane.

Notably, in this example, the two field effect transistors of the second size (i.e., the third field effect transistor 52*c* and the fourth field effect transistor 52*d*) may correspond to a single field effect transistor of the first size (i.e., the first field effect transistor 52*a*, the second field effect transistor 52*b*, the fifth field effect transistor 52*e*, and the sixth field effect transistor 52*f*). Therefore, in this example, the field effect transistors of the second size may have approximately half the power delivery characteristics (i.e., operating current, voltage, and/or power) as a field effect transistor of the first size. Because two field effect transistors of the second size may correspond to a single field effect transistor of the first size, in this example, the field effect transistors of the second size may be referred to as "half field effect transistors." Moreover, by connecting a field effect transistor of the first size with a field effect transistor of the second size in a respective set such that the field effect transistors operate in parallel, the operating parameters of the respective set of field effect transistors formed thereby may be greater (e.g., higher operating current, voltage, and/or power) as compared to the operating parameters of a first sized field effect transistor and a second sized field effect transistor.

Furthermore, due to the physical characteristics of the second sized field effect transistors, it may be noted that the two field effect transistors of the second size are arranged to correspond to one field effect transistor of the first size, where the array of field effect transistors are arranged in a column such that the two field, effect transistors of the second size are disposed between field effect transistors of the first size. In addition, in some examples, the number of field effect transistors may be greater than the number of fluid actuators. Moreover, the number of field effect transistors may not be an integer multiple of the number of fluid actuators. To illustrate by way of example, the fluidic die of FIG. 2 illustrates 6 field effect transistors and 4 fluid actuators.

Furthermore, while not explicitly shown in this example, it may be appreciated that field effect transistors described as interconnected may have gates and sources thereof connected together, and the drains of the interconnected field effect transistors may be connected to a common voltage supply. Accordingly, interconnected field effect transistors may operate in parallel. Therefore, while the connecting members 56a-b of FIG. 2 (and other block diagrams described below) only illustrate single elements connecting the FETs, these single element connections are merely for illustrative purposes. Hence implementations corresponding to such example diagrams may include sets of wires, jumpers, conductive traces, etc. that facilitate connecting gates, sources, and/or drains together such that the interconnected field effect transistors operate in parallel.

Figure 3:
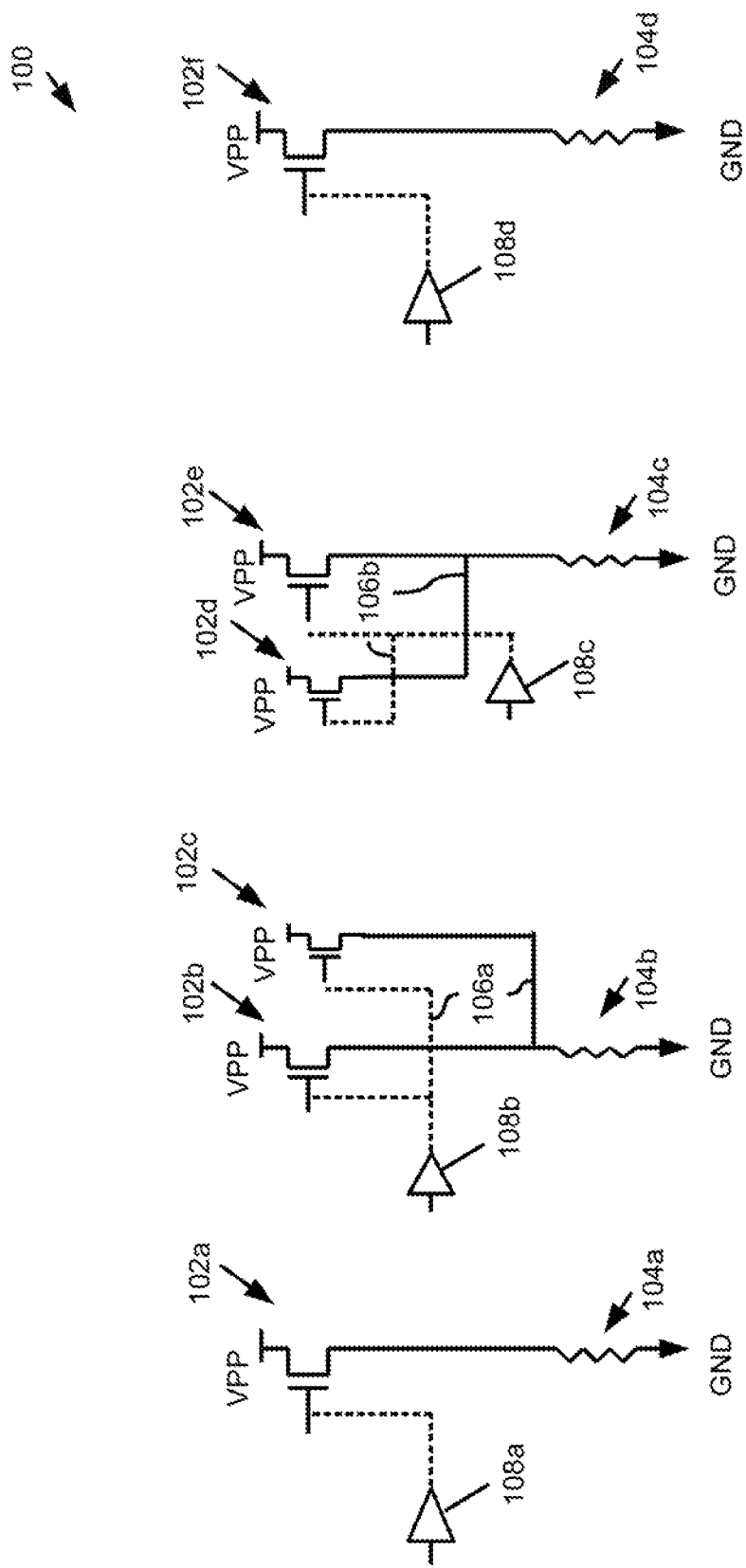
FIG. 3 is a logic diagram that illustrates some components of an example fluidic die.

FIG. 3 provides a logic diagram of some components an example fluidic die 100. In this example, the fluidic die 100 includes an array of field effect transistors 102a-f, and the die 100 includes fluid actuators 104a-d. As shown, a first field effect transistor 102a, of a first size, is connected to a first fluid actuator 104a such that the first fluid actuator 104a is connected to a respective set of field effect transistors that includes the first field effect transistor 102a. A first connecting member 106a interconnects a second field effect transistor 102b, of the first size, and a third field effect transistor 102c, of a second size, such that a second fluid actuator 104b is connected to a respective set of field effect transistors that includes the second field effect transistor 102b and the third field effect transistor 102c.

A second connecting member 106b interconnects a fourth field effect transistor 102d, of the second size, and a fifth field effect transistor 102e, of the first, size, such that a third fluid actuator 104c is connected to a respective set of field effect transistors that includes the fourth field effect transistor 102d and the fifth field effect transistor 102e. A sixth field effect transistor 102f is connected to a fourth fluid actuator 104d such that the fourth fluid actuator 104d is connected to a respective set of field effect transistors that includes the sixth field effect transistor 102f.

In this example, a drain of each field effect transistor 102a-f may be coupled to a common voltage source (labeled 'VPP'), and a source of each FET 102a-h is connected to ground (labeled 'GND') through a fluid actuator 104a-d. The first connecting member 106a connects a gate of the second field effect transistor 102b and a gate of the third field effect transistor 102c, and the first connecting member 106a connects a source of the second field effect transistor 102b and a source of the third field effect transistor 102c. Similarly, the second connecting member 106b connects a gate of the fourth field effect transistor 102d and a gate of the fifth field effect transistor 102e, and the second connecting member 106b connects a source of the fourth field effect transistor 102d and a source of the fifth field effect transistor 102e. Gate drive logic 108a-f is coupled to a gate of each field effect transistor 102a-f. Notably, a respective gate drive logic 108a-d is coupled to the gates of each field effect transistor 102a-f of each respective set of field effect transistors. For example, a first gate drive logic 108a is connected to a gate of the first field effect transistor 102a, and addressing the first gate drive logic 108a enables the gate of the first field effect transistor 102a. In response to enabling the gate of the first field effect transistor 102a, the first fluid actuator 104a actuates. As another example, a second gate drive logic 108b is connected to a gate of the second field effect transistor 102b, and the second gate drive logic 108b is connected to a gate of the third field effect transistor 102c. Accordingly, addressing the second gate drive logic 108b enables the gate of the second field effect transistor 102b and the third field effect transistor 102c, which, in turn, actuates the second fluid actuator 104b.

Accordingly, in this example, the first fluid actuator 104a and the fourth fluid actuator 104d may correspond to a first type of fluid actuator, and the second fluid actuator 104b and third fluid actuator 104c may correspond to a second type of fluid actuator. In some examples, a type of a fluid actuator may correspond to a fluid actuator size, an actuation type (e.g., thermal resistor actuation, piezoelectric membrane actuation, etc.), and/or an implementation (e.g., a fluid pump, a fluid ejector). The first type of fluid actuators (i.e., the first fluid actuator 104a and the fourth fluid actuator 104d) may be driven by a single field effect transistor. The second type of fluid actuator (i.e., the second fluid actuator 104b and the third fluid actuator 104c) may be driven by at least two interconnected field effect transistors. In this particular example, the second type of fluid actuator may be driven by a field effect transistor of the first size interconnected with a field effect transistor of the second size, such that the interconnected field effect transistors operate in parallel.

Figure 4:
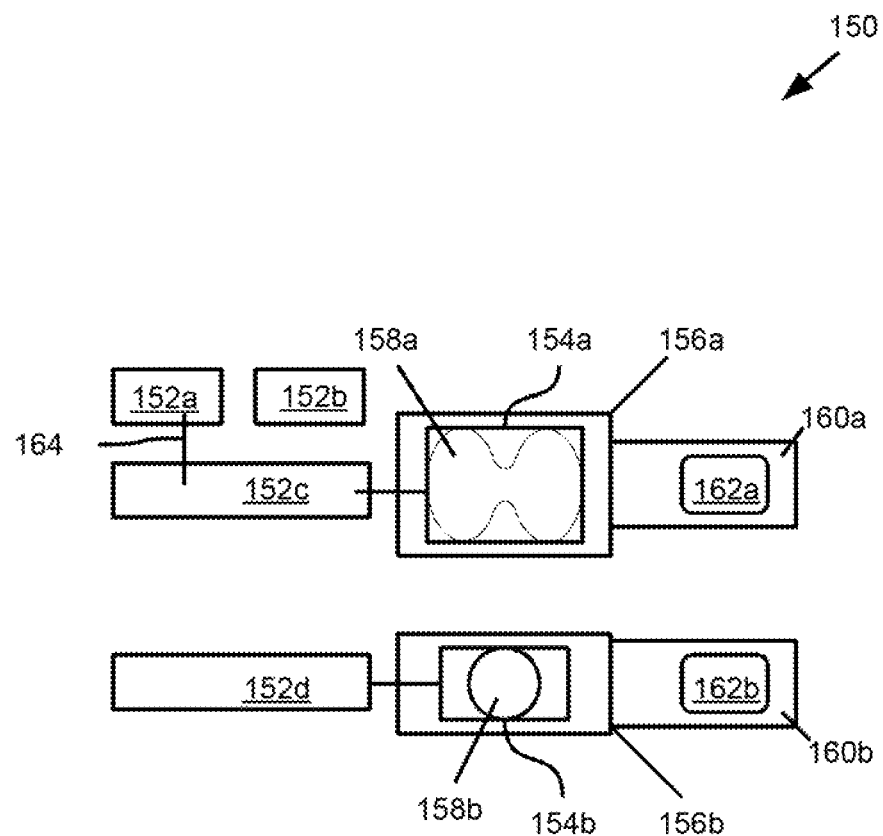
FIG. 4 is a block diagram that illustrates some components of an example fluidic die.

Turning now to FIG. 4, this figure provides a block diagram that illustrates some components of an example fluidic die 150. In this example, the fluidic die 150 comprises an array of field effect transistors 152a-d, which includes a first field effect transistor 152a, a second field effect transistor 152b, a third field effect transistor 152c, and a fourth field effect transistor 152d. The third field effect transistor 152c and the fourth field effect transistor 152d may be a first size, and the first field effect transistor 152a and second field effect transistor may be a second size.

The die 150 further includes fluid actuators 154a-b. In this example, each fluid actuator 154a-b is disposed in a respective fluid chamber 156a-b. Furthermore, each respective fluid chamber 156a-b is fluidically coupled to a respective nozzle 158a-b, and each respective fluid chamber 156a-b is fluidically coupled to a respective microfluidic channel 160a-b through which fluid may flow to the respective fluid chamber 156a-b. In this example, each microfluidic channel 160a-b includes a respective fluid supply passage 162a-b that may be fluidically coupled to a fluid supply channel, fluid supply slot, or other larger volume fluid reservoir. In some examples, microfluidic channels 160a-b of the fluid chambers 156a-b may be connected to a common fluid supply slot.

An example connecting member 164 interconnects the first field effect transistor 152a and the third field effect transistor 152c. A first fluid actuator 154a is connected to a first respective set of field effect transistors that includes the first field effect transistor 152a and the third field effect transistor 152c. A second fluid actuator 154b is connected to a second respective set of field effect transistors that includes the fourth field effect transistor 152d is connected to a second fluid actuator 154b. Accordingly, the fourth field effect transistor 152d.

As shown, the first fluid actuator 154a is disposed in a first fluid chamber 156a, where the first fluid chamber 156a is fluidically coupled to a first nozzle 158a, and the first fluid chamber 156a has a first chamber volume. The second fluid actuator 154b is disposed in a second fluid chamber 156b, where the second fluid chamber 156b is fluidically coupled to a second nozzle 158b, and the second fluid chamber 156b may have a second chamber volume. In some examples chamber volumes of respective fluid chambers in which fluid actuators may be disposed may be different. In the example provided in FIG. 4, the first chamber volume may be greater than the second chamber volume.

Furthermore, the first nozzle 158a may have a first nozzle orifice size and/or geometry, and the second nozzle 158b may have a second nozzle orifice size and/or geometry. In some examples, the nozzle orifice size of respective nozzles of a fluidic die may be different. In this example, the first nozzle orifice size may be greater than the second nozzle orifice size. In addition, in some examples the fluid actuator size of respective fluid actuators of a fluidic die may be different. For the example die 150 provided in FIG. 4, it may be noted that a fluid actuator size of the first fluid actuator 154a may be greater than a fluid actuator size of the second fluid actuator 154b. Accordingly, the first fluid actuator 154a may be a first type of fluid actuator, and the second fluid actuator 154b may be a second type of fluid actuator. In this example, the distinction between the fluid actuator types may correspond to fluid actuator size. As a further clarification, the distinction between fluid actuator types may correspond to a fluid drop size which the respective fluid actuator may cause responsive to actuation of the fluid actuator.

Accordingly, the example die 150 includes the first fluid actuator 154a, the first fluid chamber 156a, and the first nozzle 158a that may be collectively referred to as a first drop generator. The die 150 also includes the second fluid actuator 154b, the second fluid chamber 156b, and the second nozzle 158b that may be collectively referred to as a second drop generator. In this example, the first drop generator may correspond to a first fluid drop size, and the second drop generator may correspond to a second fluid drop size, where the two fluid drop sizes are different.

In particular, the first nozzle 158a may have a noncircular nozzle orifice that is designed to facilitate ejection of large fluid drop sizes (e.g., approximately 5 pL to approximately 10 pL drop volumes, approximately 5 ng to approximately 10 ng drop masses). Therefore, the first chamber volume of the first fluid chamber 156a may be configured to facilitate ejection of the large fluid drop sizes. In turn, the first fluid actuator 154a may have a fluid actuator size and operating parameters that also correspond to ejection of such large size fluid drops. The second nozzle 158b may have a circular nozzle orifice that is designed to facilitate ejection of smaller fluid drop sizes (e.g., approximately 3 pL to approximately 5 pL drop volumes, approximately 3 ng to approximately 5 ng drop masses). In turn, the second fluid actuator 154b may have a fluid actuator size and operating parameters that also correspond to ejection of such smaller size fluid drops. Accordingly, the operating parameters of the first fluid actuator 154a may correspond to the first set of field effect transistors (i.e., the first field effect transistor 152a interconnected with the third field effect transistor 152c). The operating parameters of the second fluid actuator 154b may correspond to the second set of field effect transistors (i.e., the fourth field effect transistor 152d.

Figure 5:
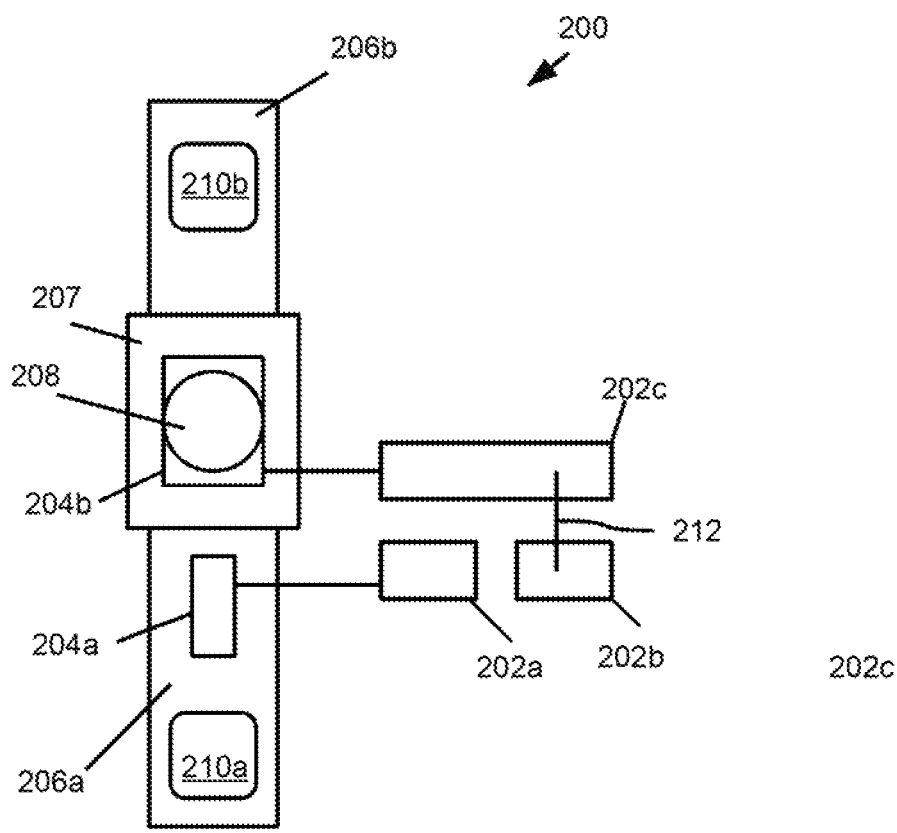
FIG. 5 is a block diagram that illustrates some components of an example fluidic die.

FIG. 5 provides a block diagram that illustrates some components of an example fluidic die 200. The fluidic die 200 comprises an array of field effect transistors 202a-c, including a first field effect transistor 202a of a first size, a second field effect transistor 202b of the first size, and a third field effect transistor 202c of a second size. The die 200 further includes fluid actuators 204a-b. In this example, a first actuator 204a is disposed in a microfluidic channel 206a-b. The microfluidic channel 206a-b is fluidically coupled to a fluid chamber 207 such that a first portion 206a of the microfluidic channel 206a-b is fluidically coupled to a first side of the fluid chamber 207 and a second portion 206b of the microfluidic channel 206a-b is fluidically coupled to a second side of the fluid chamber 207. The fluid chamber 207 is fluidically coupled to a respective nozzle 208. A second fluid actuator 204b is disposed in the fluid chamber 207 proximate the nozzle 208 such that actuation of the second fluid actuator 204b may cause ejection of a fluid drop via the nozzle 208. Accordingly, the second fluid actuator 204b may be referred to as a fluid ejector.

The microfluidic channel 206a-b is fluidically coupled to a fluid supply passage 210a at a first end of the microfluidic channel 206a-b, and the microfluidic channel 206a-b is fluidically coupled to a fluid collection passage 210b at a second end of the microfluidic channel 206a-b. The fluid supply passage 210a may supply fresh fluid to the fluid chamber 207 through the first portion 206a of the microfluidic channel 206a-b. Accordingly, the first portion 206a of the microfluidic channel 206a-b may be referred to as an upstream portion. Actuation of the first fluid actuator 204a may cause displacement of fluid in the microfluidic channel 206a-b such that fluid flows from the first portion 206a of the microfluidic channel 206a-b into the fluid chamber 207. Due to the fluid pumping into the fluid chamber 207 from the first portion 206a of the microfluidic channel 206a-b, fluid in the chamber 207 may flow into the second portion 206b of the microfluidic channel 206b and out of the fluid collection passage 210b. In some examples, the fluid supply passage 210a and the fluid, collection passage 210b may be coupled to a common fluid supply, in other examples, the fluid supply passage 210a and the fluid collection passage may be coupled to fluidically separated fluid supplies.

Accordingly, in this example, the first fluid actuator 204a may be implemented as a fluid pump. Actuation of the first fluid actuator 204a may create fluid displacement and flow to thereby facilitate circulation of fluid from the fluid supply passage 210a to the fluid collection passage 210b through the fluid chamber 207. Some examples of this form of fluid circulation may be referred to as microrecirculation. Since the first fluid actuator 204a and the second fluid actuator 204b may be implemented to perform different operations, the fluid actuator size of the first fluid actuator 204a and the fluid actuator size of the second fluid actuator 206a may be different. Therefore, the first fluid actuator 204a and the second fluid actuator 204b may be connected to different numbers and arrangements of field effect transistors 202a-c. Since the first fluid actuator 204a is implemented as a fluid pump, the first fluid actuator 204a may correspond to a first type of fluid actuator. Similarly, because the second fluid actuator 204b is implemented as a fluid ejector, the second fluid actuator may correspond to a second type of fluid actuator.

In this example, the first fluid actuator is connected to a first set of field effect transistors comprising the first field effect transistor 202a. Since the first field effect transistor 202a is not connected to other field effect transistors via connecting members, the first fluid actuator has operating parameters that correspond to the first fluid actuator 202a, which is the first size. The second fluid actuator 204b has greater operating parameters (e.g., greater voltage and current thresholds for proper operation) than the first fluid actuator 204b. Therefore, as shown in this example, the second field effect transistor 202c, and the third field effect transistor 202c may be interconnected via connecting members 212 to form a second set of field effect transistors 202b-c that is connected to the second fluid actuator 204b. Therefore, in this example, the second fluid actuator is connected to the second set of field effect transistors that includes at least one field effect transistor of the second size (i.e., the third field effect transistor 202c) connected to at least one other field effect transistor (i.e., the second field effect transistor 202b). Hence, as illustrated in this example, utilizing different sized field effect transistors in a FET array may facilitate flexible fluid actuator layouts, where different sized FETs may be interconnected to correspond to different fluid actuator operating parameters.

Figure 6:
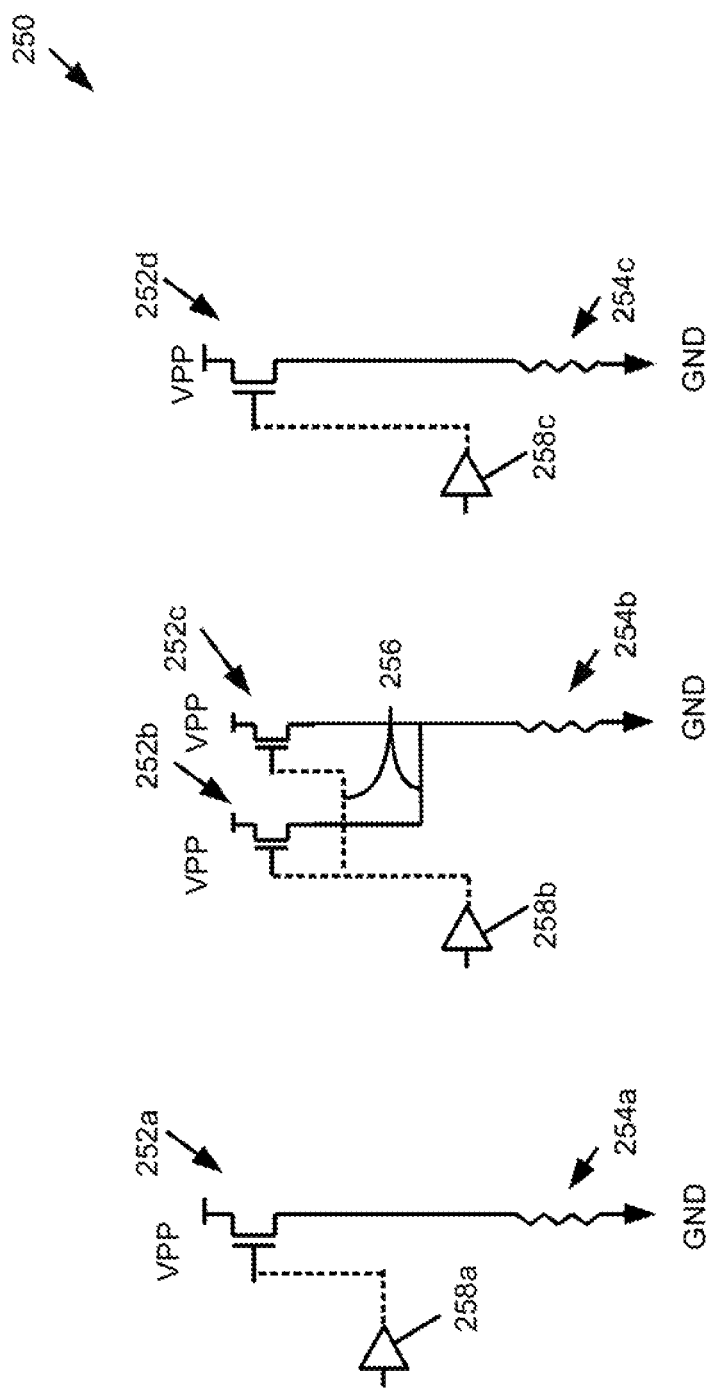
FIG. 6 is a logic diagram that illustrates some components of an example fluidic die.

FIG. 6 provides a logic diagram of some components an example fluidic die 250. In this example, the fluidic die 250 includes an array of field effect transistors 252a-d, and the die 250 includes fluid actuators 254a-c. The array of field effect transistors includes field effect transistors of a first size and field effect transistors of a second size. In particular, the array includes a first field effect transistor 252a of the first size, a second field effect transistor 252b of the second size, a third field effect transistor 252c of the second size, and a fourth field effect transistor 252d of the first size.

As shown, a connecting member 256 interconnects the second field effect transistor 252a and the third field effect transistor 252c such that the second field effect transistor 252b and the third field effect transistor 252c operate in parallel. Particularly, as shown, a drain of the second field effect transistor 252b and a drain of the third field effect transistor 252c are commonly connected to a voltage source (labeled 'VPP'). The connecting member 256 connects a gate of the second field effect transistor 252b and a gate of the third field effect transistor 252c, and the connecting member 256 connects a drain of the second field effect transistor 252b and a drain of the third field effect transistor 252c.

A first fluid actuator 252a is connected to a first respective set of field effect transistors that comprises the first field effect transistor 252a. A second fluid actuator 254b is connected to a second respective set of field effect transistors that includes the second field effect transistor 252b and the third field effect transistor 252c. A third fluid actuator 254c is connected to a third respective set of field effect transistors that includes the fourth field effect transistor 252d.

In this example, a drain of each field effect transistor 252a-d may be coupled to a voltage source (labeled 'VPP'), and a source of each field effect transistor 252a-d may be connected to ground (labeled 'CND') through a respective fluid actuator 254a-c. Respective gate drive logic 258a-c is coupled to a gate of each field effect transistor 252a-d. Notably, a respective gate drive logic 258a-c is coupled to the gates of each field effect transistor 252a-d of each respective set of field effect transistors. For example, a first gate drive logic 258a is connected to a gate of the first field effect transistor 252a. Accordingly, addressing the first gate drive logic 258a enables the gate of the first field effect transistor 252a, which, in turn actuates the first fluid actuator 254a. As another example, the gate of the second field effect transistor 252b and the gate of the third field effect transistor 252c are connected to a second gate drive logic 258b. As discussed above, the second field effect transistor 252b and the third field effect transistor 252c operate in parallel. Addressing the second gate drive logic 258b enables the gate of the second field effect transistor 252b and the third field effect transistor 252c such that the second fluid actuator 254b is actuated.

In this example, the field effect transistors of the first size may be larger (and therefore have greater operating thresholds and limits) than field effect transistors of the second size. Two of the second sized field effect transistors 252b, 252c may correspond to a single field effect transistor of the first size 252a, 252d. Therefore, interconnecting the second and third field effect transistors 254a-c may result in electrical characteristics similar to the electrical characteristics of a first sized field effect transistor.

Figure 7:
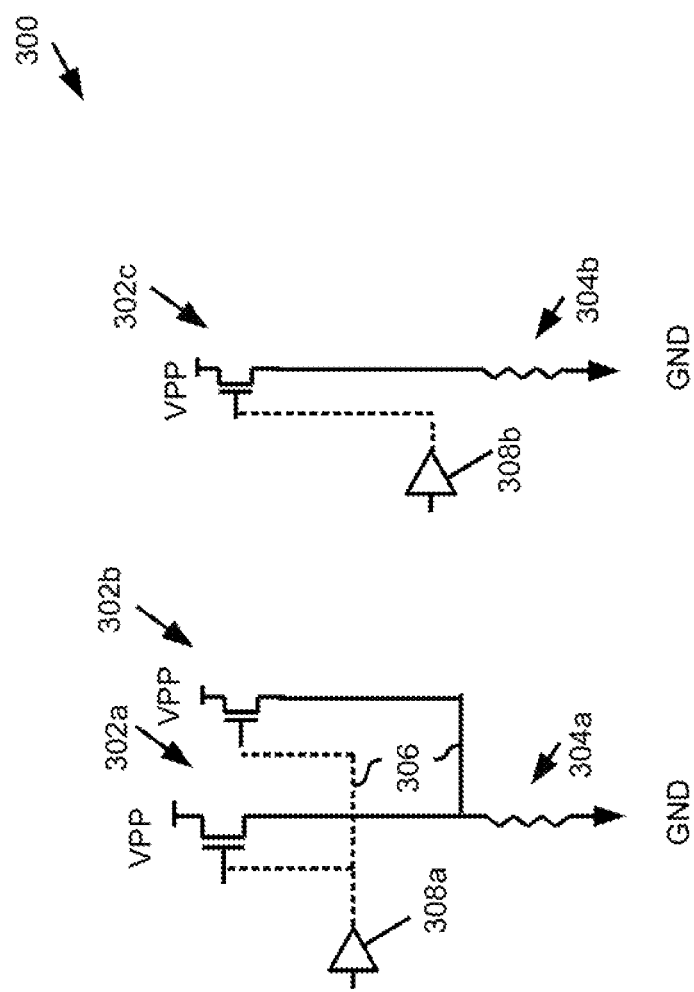
FIG. 7 is a logic diagram that illustrates some components of an example fluidic die.

FIG. 7 provides a logic diagram of some components an example fluidic die 300. In this example, the fluidic die 300 includes an array of field effect transistors 302a-d, and the die 300 includes fluid actuators 304a-b. The array of field effect transistors includes field effect transistors of a first size and field effect transistors of a second size. In particular, the array includes a first field effect transistor 302a of the first size, a second field effect transistor 302b of the second size, and a third field effect transistor 302c of the second size.

As shown, a connecting member 306 interconnects the first field effect transistor 302a and the second field effect transistor 302b such that the first field effect transistor 302a and the second field effect transistor 302b operate in parallel. The connecting member 306 connects a gate of the first field effect transistor 302a and a gate of the second field effect transistor 302b, and the connecting member 306 connects a source of the first field effect transistor 302a and a source of the second field effect transistor 302b. A drain of the first field effect transistor 302a and a drain of the second field effect transistor 302b may connected to a voltage supply.

A first fluid actuator 304a is connected to a first respective set of field effect transistors that comprises the first field effect transistor 302a and the second field effect transistor 302b. A second fluid actuator 304b is connected to a second respective set of field effect transistors that includes the third field effect transistor 302c.

In this example, a drain of each field effect transistor 302a-c may be coupled to a common voltage source (labeled 'VPP'), and a source of each field effect transistor 302a-c may be connected to ground through a respective fluid actuator 302a-b (labeled 'GND'). Respective gate drive logic 308a-b is coupled to a gate of each respective field effect transistor 302a-c. For example, a first gate drive logic 308a is connected to a gate of the first field effect transistor 302a and a gate of the second field effect transistor 302b. Accordingly, addressing the first gate drive logic 308a enables the gate of the first field effect transistor 302a and the gate of the second field effect transistor 302b, which, in turn actuates the first fluid actuator 304a. As another example, a gate of the third field effect transistor 302c is connected to a second gate drive logic 308b. Addressing the second gate drive logic 308b enables the gate of the third field effect transistor 302c such that the second fluid actuator 304b is actuated.

In this example, the field effect transistor of the first size may be larger (and therefore have greater operating thresholds and limits) than field effect transistors of the second size. As shown, by interconnecting the first and second field effect transistors 302a-b in parallel, the electrical operating limits associated with the first fluid actuator 304a may be greater than the electrical operating limits associated with the second fluid actuator 304b.

Figure 8:
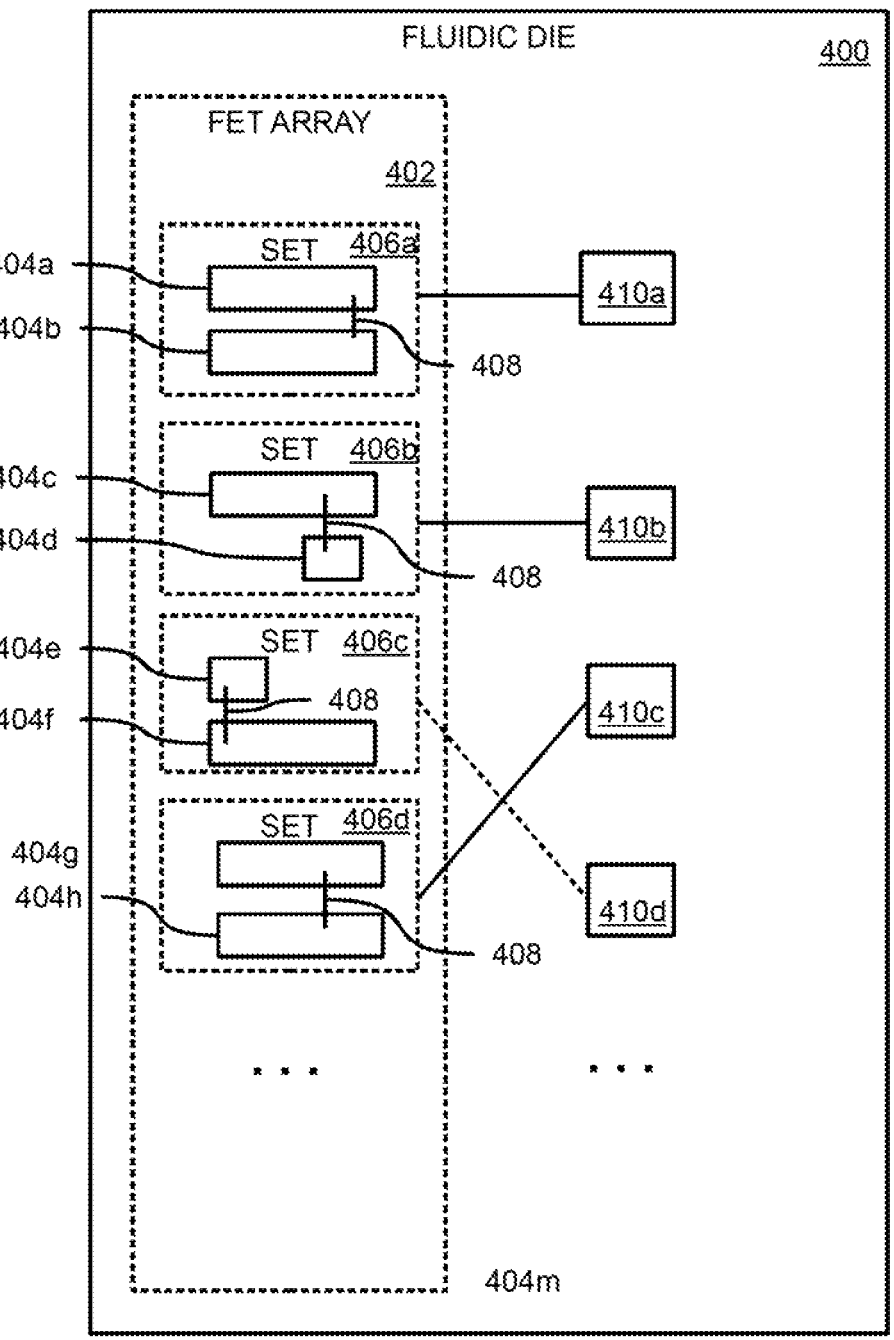
FIG. 8 is a block diagram that illustrates some components of an example fluidic die.

FIG. 8 provides a block diagram that illustrates some components of an example fluidic die 400. As shown, the fluidic die 400 includes an array of field effect transistors 402. As shown, the array 402 includes field effect transistors 404a-m arranged in respective sets 406a-e. In particular, different numbers of field effect transistors may be connected via connecting members 408 to form respective sets 406a-e. Each set 406a-e of field effect transistors 404a-m are connected to a respective fluid actuator 410a-e.

In this example, a first set 406a may include a first field effect transistor 404a, of a first size, and a second field effect transistor 404b, of the first size that are interconnected via a connecting member 408. As shown, the first set 406a is connected to a first fluid actuator 410a. A second set 406b may include a third field effect transistor 404c, of the first size, and a fourth field effect transistor 404d of a second size that is different than the first size. The third field effect transistor 404c and the fourth field effect transistor 404d are interconnected via a connecting member 408. The second set 406b is connected to a second fluid actuator 410b. A third set 4060 includes a fifth field effect transistor 404e, of the second size, and, a sixth field effect transistor 404f, of the first size, that are interconnected via a connecting member 408. The third set 406c is connected to a third fluid actuator 410c. A fourth set 406d may include a seventh field effect transistor 404g, of the first size, and an eighth field effect transistor 404h, of the first size, that are interconnected via a connecting member 408. The fourth set 406d is connected to a fourth fluid actuator 410d.

Accordingly, in the example of FIG. 8, the fluidic die includes a first respective set of field effect transistors including a first field effect transistor of a first size interconnected with at least one other field effect transistor. The die further includes a second respective set of field effect transistors including a first field effect transistor of a second size interconnected with at least one other field effect transistor of the first size. While the example illustrates numbers of field effect transistors and fluid actuators, other examples may include more or less FETs and fluid actuators. In some examples, a fluidic die may comprise at least 1200 fluid actuators and a greater number of field effect transistors.

Figure 9:
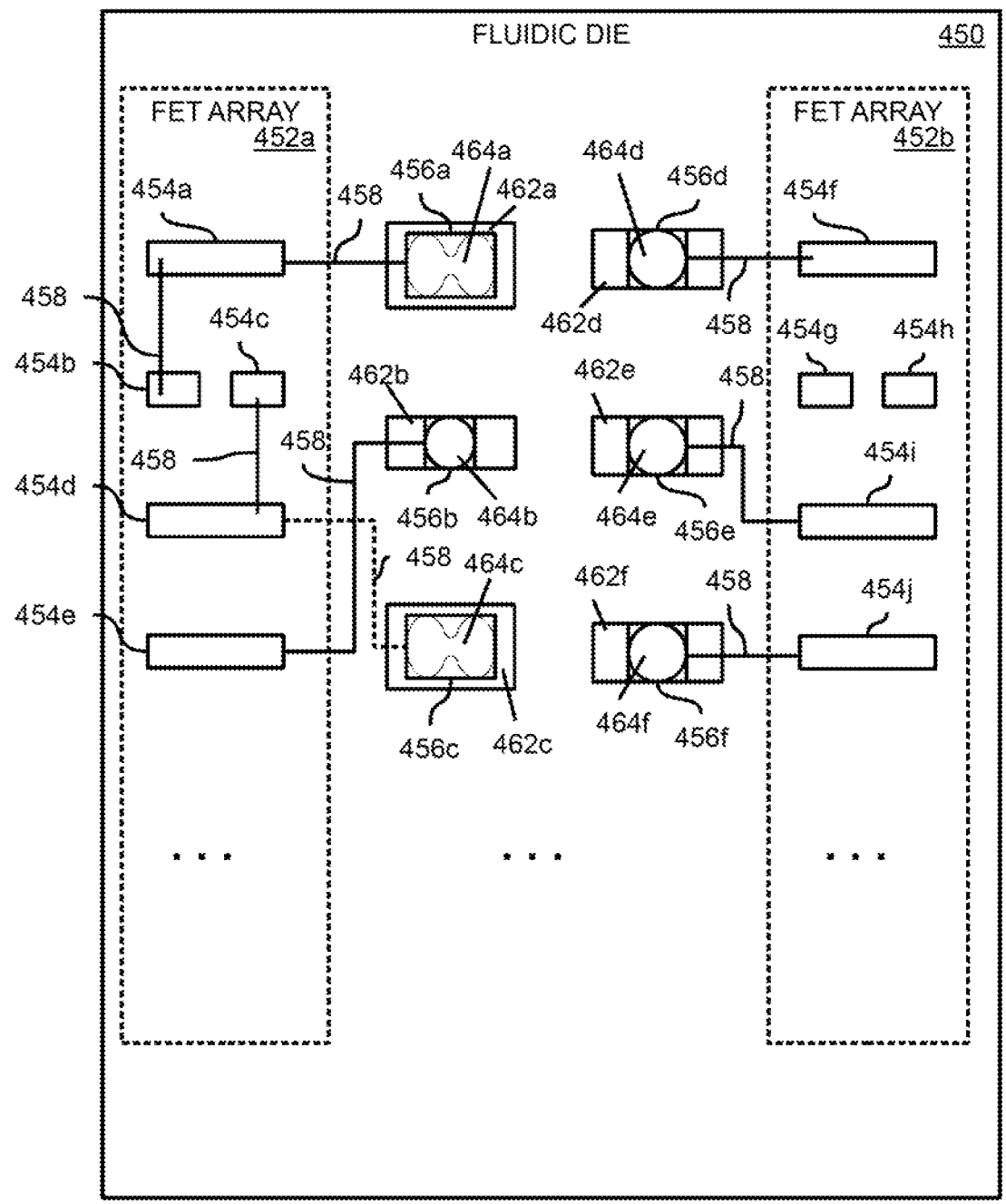
FIG. 9 is a block diagram that illustrates some components of an example fluidic die.
Figure 10:
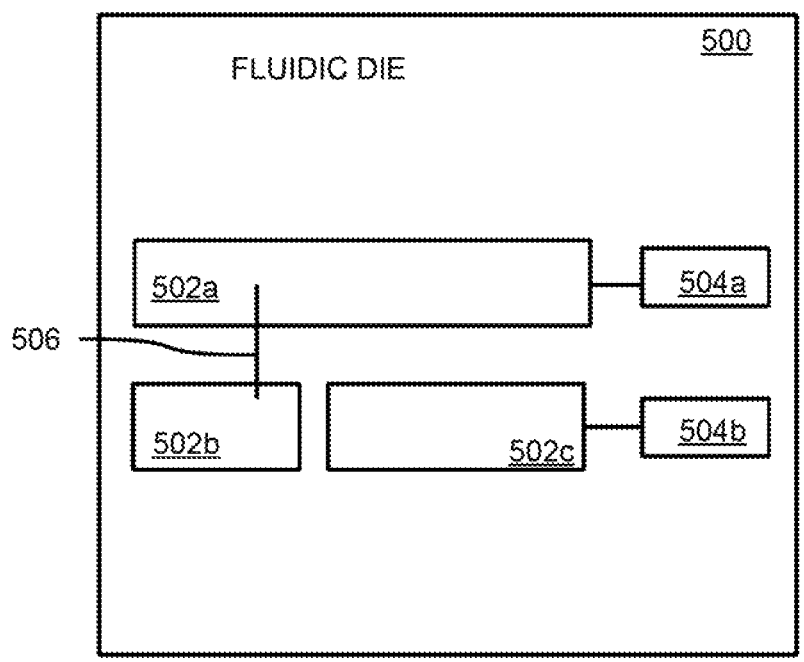
FIG. 10 is a block diagram that illustrates some components of an example fluidic die.

FIG. 9 provides a block diagram that illustrates some components of an example fluidic die 450. As shown, the fluidic die 450 includes arrays of field effect transistors 452a-b, where the arrays 452a-b include field effect transistors 454a-j of different sizes arranged in a column for each array 452a-b. The die 450 further includes a plurality of fluid actuators 456a-f. Different numbers of field effect transistors 454a-j of different sizes may be interconnected via connecting members 458.

In this example, a first array 452a may include a first field effect transistor 454a of a first size, a second field effect transistor 454b of a second size, a third field effect transistor 454c of the second size, a fourth field effect transistor 454d of the first size, and a fifth field effect transistor 454e of the first size. The second array 452b may include a sixth field effect transistor 454f of a first size, a seventh field effect transistor 454g of a second size, an eighth field effect transistor 454h of the second size, a ninth field effect transistor 454i of the first size, and a tenth field effect transistor 454j of the first size.

The fluid actuators 456a-f may be connected to sets of field effect transistors via connecting members 458. A first fluid actuator 456a may be connected to a first set of field effect transistors including the first field effect transistor 454a and the second field effect transistor 454b interconnected via a connecting member 458. As shown, the first field effect transistor 454a may be a first size, and the second field effect transistor 454b may be a second size. A second fluid actuator 456b may be connected to a second set of field effect transistors including the fifth field effect transistor 454e. A third fluid actuator 456c may be connected to a third set of field effect transistors including the third field effect transistor 454c (of the second size) and the fourth field effect transistor 454d (of the first size), which are interconnected via a connecting member 458. A fourth fluid actuator 456d is connected to a fourth set of field effect transistors comprising the sixth field effect transistor 454f. A fifth fluid actuator 456e is connected to a fifth set of field, effect transistors including the ninth field effect transistor 454i. A sixth fluid actuator 456f is connected to a sixth set of field effect transistors including the tenth field effect transistor 454j.

Each respective fluid actuator 456a-f of the fluidic die 450 may be disposed in a respective fluid chamber 462a-f. Each respective fluid chamber 462a-f may be fluidically coupled to a respective nozzle 464a-f. The columnar arrangements of fluid actuators 456a-f, fluid chambers 462a-f, and nozzles 464a-f may be referred to as nozzle columns. Accordingly, this example fluidic die 450 includes at least two nozzle columns. Other examples may include more nozzle columns. Similarly, the example fluidic die 450 may include a respective field effect transistor array 452a-b for each respective nozzle column. Accordingly, while this example includes two arrays 452a-b, other examples may include more.

Similar to other examples provided herein, the field effect transistors 454a-j of the fluidic die 450 may be configured with connecting members 458 to implement different arrangements of field effect transistors 454a-p of different sizes to correspond to different fluid actuator arrangements. Furthermore, the arrays of field effect transistors 452a-b facilitate arranging and interconnecting field effect transistors 454a-j based at least in part on operating parameters of fluid actuators 456a-f to which the field effect transistors 454a-j are respectively connected.

In this example, the first fluid actuator 456a is disposed in a first fluid chamber 462a that is fluidically coupled to a first nozzle 464a. As shown, the first nozzle 464a may correspond to a noncircular nozzle orifice shape that may have a first nozzle orifice size that may facilitate ejection of fluid drops of a first drop size. Accordingly, the first fluid chamber 462a may have a first chamber volume that corresponds to ejection of fluid drops of a first drop size. In turn, the first fluid actuator 456a may be a first type of fluid actuator, where the first type of fluid actuator may be configured to cause displacement of an amount of fluid that corresponds to the first chamber volume and/or the first drop size. Therefore, in this example, the first fluid actuator 456a is connected to the first set of field effect transistors 454a-b that includes at least two interconnected field effect transistors, which in this example are also of different sizes. The electrical characteristics of the interconnected field effect transistors of the first set 454a-b may correspond to the operating parameters of the first fluid actuator 456a.

In contrast, the second fluid actuator 456b is disposed in a second fluid chamber 462b that is fluidically coupled to a second nozzle 464b. As shown, the second nozzle 464b may correspond to a circular nozzle orifice shape that may have a second nozzle orifice size that may facilitate ejection of fluid drops of a second drop size, where the second drop size may be less than the first drop size. Hence, the first nozzle orifice size may be greater than the second nozzle orifice size. The second fluid chamber 462b may have a second chamber volume that corresponds to ejection of the second drop size, such that the second chamber volume may be less than the first chamber volume. In turn, the second fluid actuator 460b may correspond to a second type of fluid actuator, where the second type of fluid actuator may be configured to cause displacement of an amount of fluid that corresponds to the second chamber volume and/or the second drop size. Therefore, in this example, the second fluid actuator 456b is connected to the second set of field effect transistors that includes the single field effect transistor 454e. The electrical characteristics of the single field effect transistor of the second set corresponds to the operating parameters of the second fluid actuator 456b.

Figure 12:
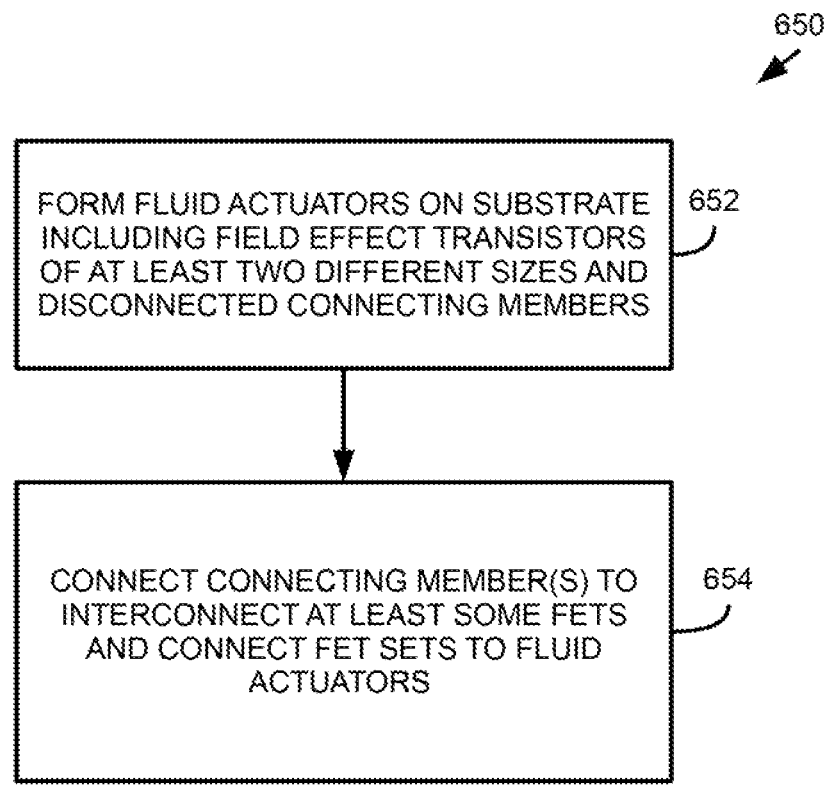
FIG. 12 is a flowchart that illustrates an example sequence of operations of an example process.

As another example, the fifth fluid actuator 456e is disposed in a fifth fluid chamber 462e that is fluidically coupled to a fifth nozzle 464e. As shown, the fifth nozzle 464e may correspond to a circular nozzle orifice shape that may have a third nozzle orifice size that may facilitate ejection of fluid drops of a third drop size. The third drop size may be less than the first drop size, and the third drop size may be greater than the second drop size. Hence, the first nozzle orifice size may be greater than the third nozzle orifice size, and the second nozzle orifice size may be less than the third nozzle orifice size. The fifth, fluid chamber 462e may have a third chamber volume that corresponds to ejection of fluid drops of the third drop size. Accordingly, the third chamber volume may be less than the first chamber volume, and the third chamber volume may be greater than the second chamber volume. In turn, the fifth fluid actuator 456e may correspond to a third type of fluid actuator, where the third type of fluid actuator may be configured to cause displacement of an amount of fluid that corresponds to the third chamber volume and/or the third drop size. Therefore, in this example, the fifth fluid actuator 445e is connected to the fifth set of field effect transistors that includes a single field effect transistor 454i of the first size. The electrical characteristics of the single field effect transistor 454i of the first size may correspond to the operating parameters of the fifth fluid actuator 456e. While the example of FIG. 12 illustrates the first type of fluid actuator and the second type of fluid actuator in a first nozzle column and the third type of fluid actuator in a second nozzle column, other examples may implement different arrangements. For example, at least three different fluid actuator types may be implemented in a single nozzle column. As another example, only a single fluid actuator type may be implemented in each nozzle column, while the example fluidic die may include at least two fluid actuator types. In other examples, a third type of fluid actuator may correspond to a fluid pump disposed in a microfluidic channel.

Furthermore, in this example, it may be noted that the seventh and eighth field effect transistors 454g-h may not be connected to a fluid actuator. As described previously, examples provided herein correspond to arrangements of field effect transistors that may be set according to fluid actuator types and arrangements. In this example, the unconnected seventh and eight field effect transistors 454g-h illustrate, by way of example, that the FETs arrays provided herein may accommodate various fluid actuator layouts having different types of fluid actuators. In some examples, field effect transistors not connected to a fluid actuator may be connected to a reference node (e.g., ground) through a connecting member to thereby reduce fault conditions.

As described herein, the combination of a respective fluid actuator disposed in a respective fluid chamber, where the respective chamber is fluidically connected to a respective nozzle may be referred to as a drop generator. Various dimensions and operating parameters of the components of a drop generator may correspond to a fluid drop size that is generated by the drop generator. While the example of FIG. 9 illustrates different nozzle orifice sizes, different fluid chamber volumes, and different fluid actuator sizes, it may be noted that differences in the dimensions and operating parameters of any one of such characteristics may correspond to differences in fluid drop sizes. For example, two drop generators having different nozzle orifice sizes may generate fluid drops of two different sizes. In some examples, a nozzle orifice size, a fluid chamber volume, a fluid actuator size, or some combination thereof may be varied between drop generators to thereby facilitate generation of different drop sizes. Moreover, while the example of FIG. 9 illustrates drop generators that correspond to at least three different drop sizes, other examples may include drop generators that correspond to more or less different drop sizes.

Referring to FIG. 500, this figure provides a block diagram of an example fluidic, die 500. The fluidic die 500 includes an array of field effect transistors 502a-c. In this example, a first field effect transistor 502a is a first size, and a second field effect transistor 502b is a second size, and a third field effect transistor 502c is a third size. Furthermore, the fluidic die 500 includes fluid actuators 504a-b. A first fluid actuator 504a of the fluidic die 500 is connected to a first set of field effect transistors, that, in this example, includes the first field effect transistor 502a interconnected via a connecting member 506 to the second field effect transistor 502b. A second fluid actuator 504b is connected to a second set of field effect transistors that includes the third field effect transistor 502c. In this example, the second field effect transistor 502b and the third field effect transistor 502c may approximately correspond to the first field effect transistor 502a.

Furthermore, the third size of the third field effect transistor 502c may be greater than the second size of the second field effect transistor 502b. In particular, the second size of the second field effect transistor 502b may correspond to approximately one-third of the first size of the first field effect transistor 502a, and the third size of the third field effect transistor 502c may correspond to approximately two-thirds of the first size of the first field effect transistor 502a. By interconnecting the first field effect transistor 502a and the second field effect transistor 502b to operate in parallel, the first set of field effect transistors may have electrical characteristics approximately one and one-third times (1⅓x) greater than the electrical characteristics of the first field effect transistor 502a operating independently. Similarly, the third field effect transistor 502c may have electrical characteristics approximately two-thirds of the electrical characteristics of the first field effect transistor 502a.

Figure 11:
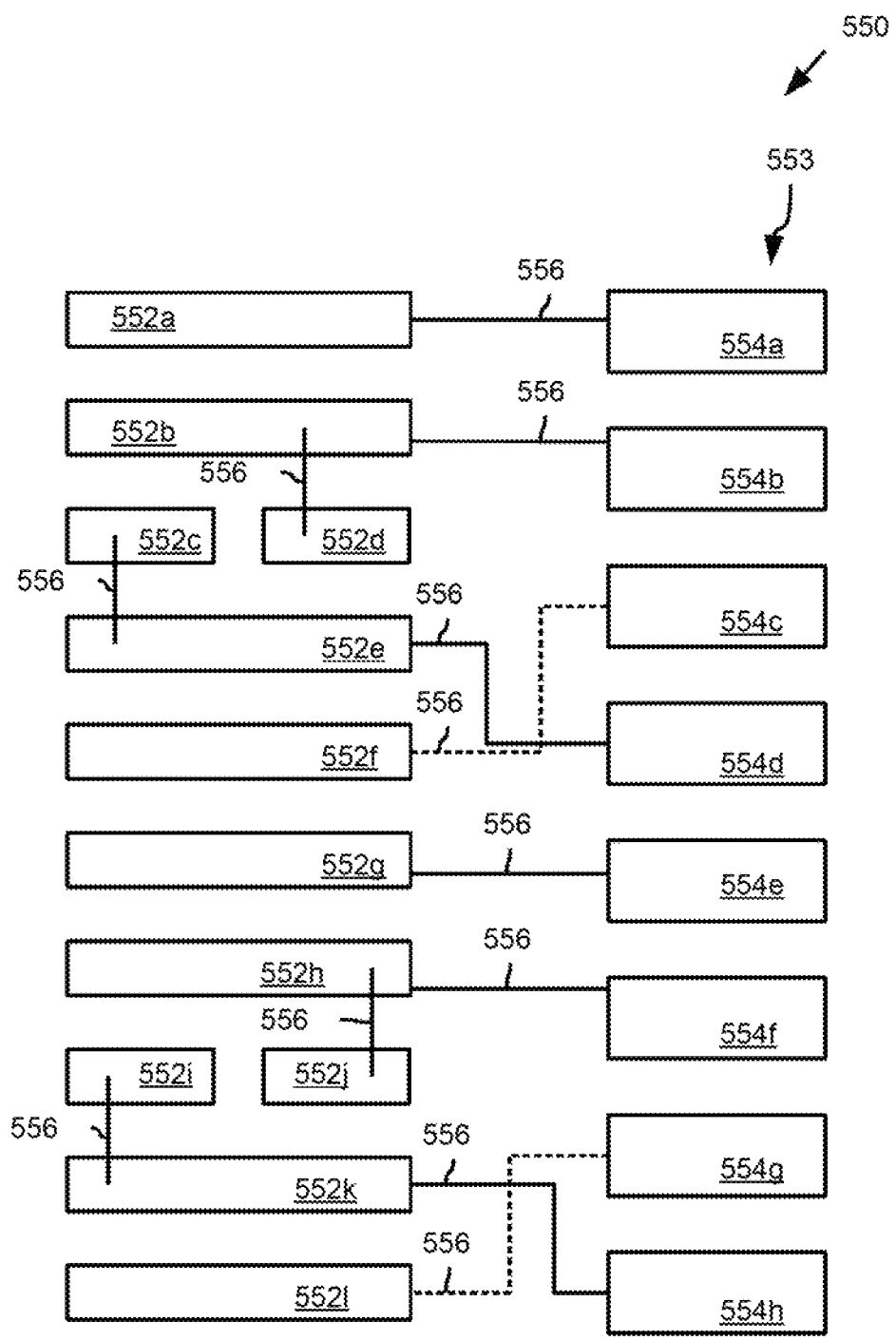
FIG. 11 is a block diagram that illustrates some components of an example fluidic die.

FIG. 11 provides a block diagram that illustrates some components of an example fluidic die 550. As shown, the fluidic die 450 includes an array of field effect transistors 552a-l, where the array 552a-l includes field effect transistors of different sizes arranged in a columnar alignment. In particular, the array includes: a first field effect transistor 552a of a first size; a second field effect transistor 552b of the first size; a third field effect transistor 552c of a second size; a fourth field effect transistor 552d of the second size; a fifth field effect transistor 552e of the first size; a sixth field effect transistor 552f of the first size; a seventh field effect transistor 552g of the first size; an eighth field effect transistor 552h of the first size; a ninth field effect transistor 552i of the second size; a tenth field effect transistor 552j of the second size; an 11th field effect transistor 552k of the first size; and a 12th field effect transistor 552l of the first size.

In this example, the fluidic die 550 includes a primitive 553 of fluid actuators 552*a-h*. In this example, the primitive 553 includes eight fluid actuators 554*a-h*. As shown, the array of field effect transistors 552*a-l* may comprise 12 field effect transistors arranged in a column of 10 rows. While this example illustrates an eight-fluid actuator primitive, other examples may include more or less fluid actuators in primitives. Furthermore, while the example, illustrates 12 field effect transistors, other examples may include more or less field effect transistors arranged in more or less columns and rows. Moreover, the example provided herein illustrates a single primitive of fluid actuators for illustrative purposes. Example fluidic dies may comprise thousands of fluid actuators arranged in hundreds of primitive. Accordingly, such examples may further comprise thousands of field effect transistors arranged as described herein.

As shown in this example, the fluidic die 550 includes some field effect transistors of different sizes interconnected via connecting members 556 such that the interconnected field effect transistors operate in parallel. Moreover, fluid actuators 554*a-h* of the primitive 553 may be connected to sets of field effect transistors 552*a-1* via respective connecting members 556. In this example, the primitive 553 includes a first fluid actuator 554*a* connected to a first respective set of field effect transistors that includes the first field effect transistor 552*a*. A second fluid actuator 554*b* is connected to a second set of field effect transistors that includes the second field effect transistor 552*b* and the fourth field effect transistor 552*d*. As may be noted, the second field effect transistor 552*b* is connected with the fourth field effect transistor 552*d* via a connecting member 556, and, furthermore, the second field effect transistor 552*b* and the fourth field effect transistors are of different sizes.

A third fluid actuator 554*c* is connected to a third respective set of field effect transistors that includes the sixth field effect transistor 552*f*. As shown, the connecting member 556 connecting the third fluid actuator 554*c* and the sixth field effect transistor 552*f* is provided in dashed line for clarity, as the connecting member 556 routes under another connecting member 556. Accordingly, the example illustrates the flexible nature of the field effect transistor arrays described herein through use of the connecting members which allow connection of FETs to various fluid actuators of a primitive.

A fourth fluid actuator 554*d* is connected to a fourth respective set of field effect transistors that includes the third field effect transistor 552*c* and the fifth field effect transistor 552*e*. The third field effect transistor 552*c* and the fifth field effect transistor 552*e* are interconnected via a respective connecting member 556 such that these FETs may operate in parallel. Moreover, the third and fifth field effect transistors 552*c*, 552*e* are of different sizes. Similar to the respective connecting member 556 connected to the third fluid actuator 554*c*, the respective connecting member 556 connected to the fourth fluid actuator 554*d* crosses over another connecting member 556. Accordingly, as shown, the arrangement of the field effect transistors in the array may not correspond to the arrangement of fluid actuators in a primitive.

A fifth fluid actuator 554*e* is connected to a fifth respective set of field effect transistors that comprises the seventh field effect transistor 552*g*. A sixth fluid actuator 554*f* is connected to a sixth respective set of field effect transistors including the eighth field effect transistor 552*h* and the tenth field effect transistor 552*j*. As shown, the eighth and tenth field effect transistors 552*h*, 552*j* are connected via a respective connecting member 556. A seventh fluid actuator 554*g* is connected to a seventh respective set of field effect transistors including the 12th field effect transistor. An eighth fluid actuator 554*h* is connected to an eighth respective set of field effect transistors that includes the ninth and 11th field effect transistors 552*i*, 552*l*. The ninth and 11th field effect transistors 552*i*, 552*k* are connected via a respective connecting member 556.

In this example, fluid actuators connected to field effect transistors of the first size may correspond to a first fluid drop size and/or a first actuation volume. Fluid actuators connected to sets of field effect transistors including a field effect transistor of the first size and a field effect transistor of the second size operating in parallel may correspond to a second fluid drop size and/or a second actuation volume. In this example, the first fluid drop size and/or first actuation volume may be less than the second fluid drop size and/or the second actuation volume. Actuation volume, as used herein, may refer to a volume of fluid proximate a fluid actuator that may be displaced responsive to actuation of the fluid actuator. For example, if a fluid actuator is implemented as a fluid ejector, the actuation volume may correspond to the fluid drop size. If a fluid actuator is implemented as a fluid pump, the actuation volume may correspond to the volume of fluid proximate the fluid actuator that is displaced responsive to actuation of the fluid actuator. As discussed previously, fluid drop size may be described in volume and/or drop mass.

Turning now to FIG. 12, this figure provides a flowchart that illustrates an example sequence of operations of an example process 650 for a fluidic die. In this example, fluid actuators may be formed on a substrate that includes a plurality of field effect transistors of at least two different sizes, and the substrate further includes disconnected connecting members (block 652). At least some connecting members may be connected to thereby interconnect some field effect transistors of the substrate and to connect fluid actuators to respective field effect transistor sets (block 654). As used herein, connecting disconnected FETs and/or connecting FET sets to fluid actuators may comprise forming one or more conductive connections on the substrate to thereby complete electrical connections between the various components. Such connecting may be performed by various microfabrication processes (including patterning an interface layer) before, concurrent, and/or after formation of other features of a fluidic die (such as forming fluid chambers, fluid actuators, etc.).

Figure 13:
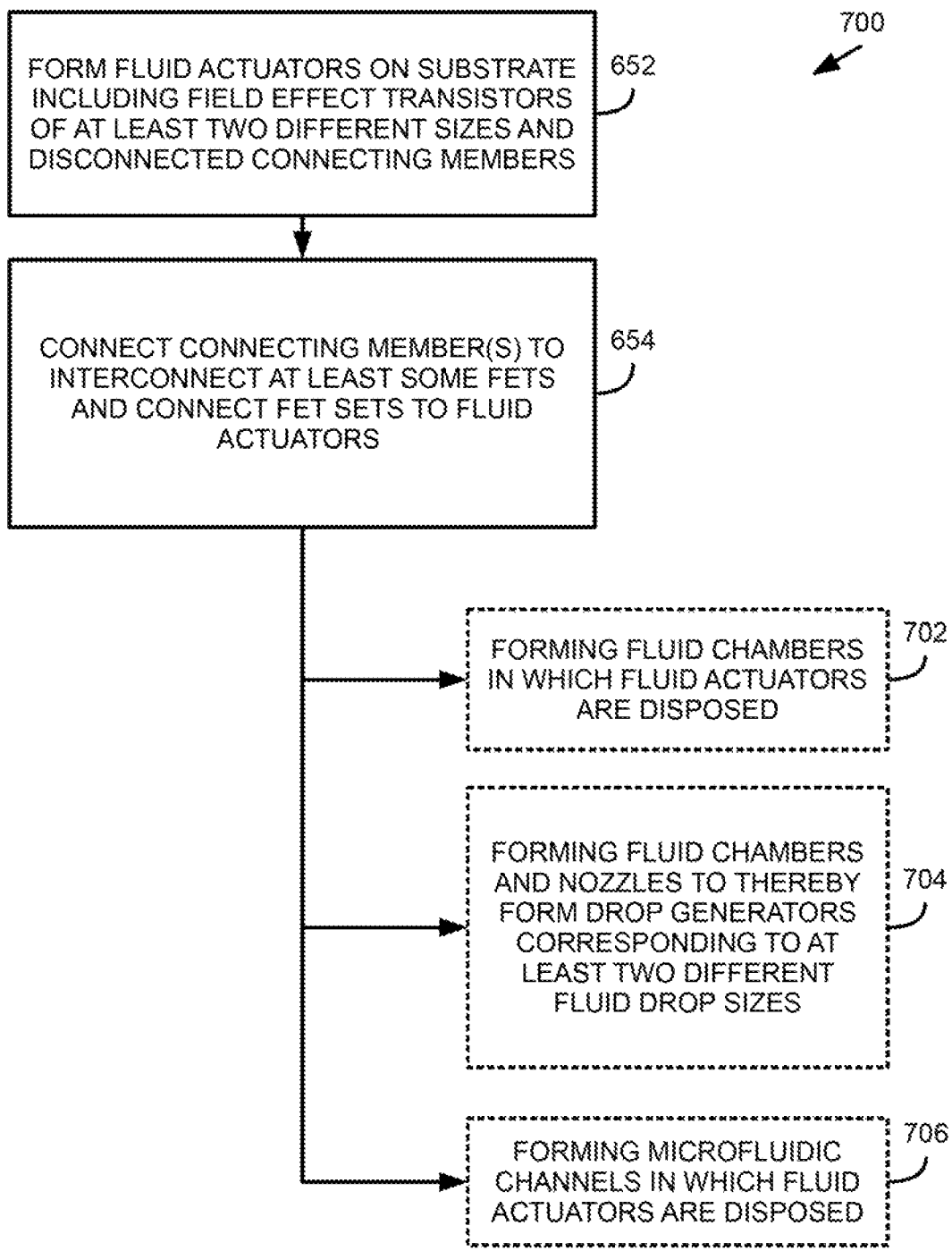
FIG. 13 is a flowchart that illustrates an example sequence of operations of an example process.

FIG. 13 provides a flowchart that illustrates an example sequence of operations of an example process 700 for a fluidic die. As described above with regard to the example process 650 of FIG. 12, the process may form fluid actuators (block 652) and connect some connecting members to interconnect some field effect transistors and to connect respective sets of field effect transistors to fluid actuators (block 654). Furthermore, in some example processes, fluid chambers may be formed for the fluidic die such that the fluid actuators are disposed in the fluid chambers (block 702). In some examples, fluid chambers and nozzles may be formed to thereby form drop generators corresponding to at least two different drop sizes (block 704). In some example processes, microfluidic channels may be formed for the fluidic die such that a respective set of the fluid actuators are disposed in the microfluidic channels (block 706).

FIGS. 14A-C provide block diagrams that illustrate some operations of an example process for a fluidic die. Referring to FIG. 14A, a substrate 800 includes a plurality of field effect transistors 802*a-e* and disconnected connecting members 804*a-n*. While the example of FIGS. 15A-C illustrates a small number of field, effect transistors 802*a-e* in a particular arrangement and one arrangement of disconnected connecting members 804a-n, other examples may include more or less field effect transistors and connecting members in various arrangements.

In FIG. 14A, the substrate 800 of the fluidic die includes a first field effect transistor 802a of a first size, a second field effect transistor 802b of a second size, a third field effect transistor 802c of the second size, a fourth field effect transistor 802d of the first size, and a fifth field effect transistor 802e of the first size. Moreover, the substrate 800 in FIG. 14A includes a first through a 14th connecting member 802a-n that are respectively labeled with corresponding letters a-n. The connecting members 804a-n are disconnected from the field effect transistors 802a-e.

In FIG. 14B, fluid actuators 806a-c are formed on the substrate 800. In FIG. 14C, some connecting members 804a-n are connected to thereby interconnect some field effect transistors 802a-e and to connect fluid actuators 806a-c to respective sets of field effect transistors 802a-e.

In this example, a first fluid actuator 806a is connected to a first set of field effect transistors that includes the first field effect transistor 802a and the second field effect transistor 802b. As shown, the first and second field effect transistors 802a-b are interconnected by connecting the first connecting member 804a therebetween. Moreover, the first fluid actuator 808a is connected to the first set of field effect transistors by connecting the seventh connecting member 804g between the first fluid actuator 806a and the first field effect transistor 802a. A second fluid actuator 806b is connected to a second set of field effect transistors that includes the fifth field effect transistor 802e by connecting the tenth connecting member 804j between the second fluid actuator 806b and the fifth field effect transistor 802e. A third fluid actuator 806c is connected to a third respective set of field effect transistors that includes the third and fourth field effect transistors 802c, 802d. As shown, the third and fourth field effect transistors 802c, 802d are interconnected by connecting the fifth connecting member 804e therebetween such that these field effect transistors 802c, 802d operate in parallel. The third set of field effect transistors is connected to the third fluid actuator 806c by connecting the 12th connecting member 804l therebetween. Other connecting members 804b-d, 804f, 804h-i, 804k, 804n may not be connected for this example arrangement of fluid actuators.

Accordingly, this example illustrates a fluidic die in which the flexibility of the field effect transistor array, having different sized field effect transistors therein, is illustrated. As shown, some connecting members of the fluidic die may be connected between FETs and between FETs and fluid actuators, while other connecting members may not be connected. As shown by way of the example of FIGS. 14A-C, field effect transistors of examples provided herein may be interconnected and connected to particular fluid actuators during processes performed on a substrate to form fluid actuators, fluid chambers, and/or other such components and features.

While the examples provided herein illustrate particular arrangements and connections of field effect transistors, voltage sources, ground, and fluid actuators, other examples are not so limited. Other examples may include field effect transistors in which drains of FETs may be connected to a voltage source through a fluid actuator, and sources of the FETs may be connected to a reference (i.e., ground). In such examples, interconnected FETs may be arranged by connecting gates of the FETs and drains of the FETs via a connecting member, and the sources of the FETs may be connected to a common reference (e.g., a common ground). A fluid actuator may be connected between the voltage supply and the connected drains of the interconnected FETs. Accordingly, for this example arrangement, addressing gates of the interconnected FETs may connect the voltage source to the reference through the fluid actuator to thereby cause actuation of the fluid actuator. Other examples may include other arrangements or combinations of the arrangements described herein.

Accordingly, examples provided herein facilitate flexible arrangements of field effect transistors of different sizes that may be configured based at least in part on design of fluidic dies. Field effect transistors may be connected via connecting members to thereby operate in parallel such that sets of field effect transistors may be configured with different numbers of field effect transistors of different sizes based at least in part on operating parameters of fluid actuators to which the sets are connected. The preceding description has been presented to illustrate and describe examples of the principles described. This description is not intended to be exhaustive or to limit these principles to any precise form disclosed. Many modifications and variations are possible in light of the description. For example, the example fluidic dies illustrated in FIGS. 1-11 and 14A-C illustrate limited numbers of field effect transistors, fluid actuators, nozzles, fluid chambers, microfluidic channels, connecting members, etc. Examples contemplated by the description provided herein are not so limited. Some example fluidic dies may comprise hundreds or even thousands of fluid actuators on a single fluidic die. Accordingly, such examples may comprise corresponding numbers of field effect transistors, connecting members, nozzles, fluid chambers, and/or microfluidic channels. For example, some fluidic dies may comprise at least four nozzle columns, with each nozzle column having at least 400 nozzles, fluid actuators, and fluid chambers per nozzle column. In such examples, the fluidic die may comprise at least four arrays of field effect transistors comprising at least 800 field effect transistors per array.

In addition, while various examples are described herein, elements and/or combinations of elements may be combined and/or removed for various examples contemplated hereby. For example, the operations provided herein in the flowcharts of FIGS. 12 and 13 may be performed sequentially, concurrently, or in a different order. Moreover, some example operations of the flowcharts may be added to other flowcharts, and/or some example operations may be removed from flowcharts. In addition, the components illustrated in the examples of FIGS. 1-11 and 14A-C may be added and/or removed from any of the other figures in any quantities. Therefore, the foregoing examples provided in the figures and described herein should not be construed as limiting of the scope of the disclosure, which is defined in the claims.

The invention claimed is:

1. A fluidic die comprising:
an array of field effect transistors including field effect transistors of a first size, and further including field effect transistors of a second size;
at least one connecting member interconnecting at least some of the field effect transistors of the array of field effect transistors;
a first fluid actuator connected to a first respective set of field effect transistors having at least one field effect transistor of the first size; and
a second fluid actuator connected to a second respective set of field effect transistors including a first respective field effect transistor of the second size interconnected to at least one other field effect transistor of the array.

2. The fluidic die of claim 1, wherein the second respective set of field effect transistors includes the first respective field effect transistor of the second size interconnected to a second respective field effect transistor of the first size.

3. The fluidic die of claim 1, wherein the second respective set of field effect transistors includes the first respective field effect transistor of the second size interconnected to a second respective field effect transistor of the second size.

4. The fluidic die of claim 1, wherein at least two field effect transistors of the second size are arranged to correspond to one field effect transistor of the first size, and the array of field effect transistors are arranged in a column such that respective at least two field effect transistor groups of the second size are disposed between respective field effect transistors of the first size.

5. The fluidic die of claim 1, wherein the array of field effect transistors includes field effect transistors of a third size, and one field effect transistor of the second size interconnected with one field effect transistor of the third size corresponds to one field effect transistor of the first size.

6. The fluidic die of claim 1 further comprising:
a first fluid chamber in which the first fluid actuator is disposed, the first fluid chamber corresponding to a first fluid drop size; and
a second fluid chamber in which the second fluid actuator is disposed, the second fluid chamber corresponding to a second fluid drop size that is different than the first fluid drop size,
wherein the respective second set of field effect transistors includes the first respective field effect transistor of the second size interconnected to a second respective field effect transistor of the first size.

7. The fluidic die of claim 1, wherein the first fluid actuator is a first fluid actuator size and the second fluid actuator is a second fluid actuator size that is larger than the first fluid actuator size.

8. The fluidic die of claim 1 further comprising:
a microfluidic channel in which the first fluid actuator is disposed; and
a fluid chamber in which the second fluid actuator is disposed, the fluid chamber fluidically coupled to the microfluidic channel.

9. The fluidic die of claim 1, wherein the first fluid actuator corresponds to a first fluid drop size, and the second fluid actuator corresponds to a second fluid drop size that is different than the first fluid drop size.

10. A fluidic die comprising:
an array of field effect transistors including field effect transistors of a first size and field effect transistors of a second size;
connecting members interconnecting at least some field effect transistors of the array; and
a plurality of fluid actuators including a first fluid actuator connected to a first respective set of field effect transistors that includes at least one respective field effect transistor of the first size interconnected with at least one respective field effect transistor of the second size.

11. The fluidic die of claim 10, wherein the plurality of fluid actuators further includes a second fluid actuator connected to a second respective set of field effect transistors that includes a single field effect transistor of the first size.

12. The fluidic die of claim 11, wherein the first fluid actuator corresponds to a first fluid drop size and the second fluid actuator corresponds to a second fluid drop size that is different than the first fluid drop size.

13. The fluidic die of claim 11, wherein the first fluid actuator corresponds to a fluid ejector and the second fluid actuator corresponds to a fluid pump.

14. A process for a fluidic die comprising:
forming fluid actuators on a substrate of the fluidic die, the substrate including field effect transistors of at least two different sizes and disconnected connecting members; and
connecting at least some connecting members to interconnect at least some field effect transistors and to connect respective sets of field effect transistors to the fluid actuators.

15. The process of claim 14, further comprising:
performing at least one of forming fluid chambers and nozzles to thereby form drop generators corresponding to at least two different fluid drop sizes, or forming microfluidic channels in which at least some fluid actuators are disposed.

* * * * *